(12) United States Patent
Li et al.

(10) Patent No.: US 8,551,850 B2
(45) Date of Patent: Oct. 8, 2013

(54) METHODS OF FORMING A REVERSIBLE RESISTANCE-SWITCHING METAL-INSULATOR-METAL STRUCTURE

(75) Inventors: Yubao Li, Milpitas, CA (US); Chu-Chen Fu, San Ramon, CA (US); Jingyan Zhang, Santa Clara, CA (US)

(73) Assignee: SanDisk 3D LLC, Milpitas, CA (US)

( * ) Notice: Subject to any disclaimer, the term of this patent is extended or adjusted under 35 U.S.C. 154(b) by 247 days.

(21) Appl. No.: 12/631,913

(22) Filed: Dec. 7, 2009

(65) Prior Publication Data

US 2011/0133151 A1  Jun. 9, 2011

(51) Int. Cl.
*H01L 21/20* (2006.01)

(52) U.S. Cl.
USPC ........... 438/381; 438/382; 438/385; 438/478; 257/E21.09

(58) Field of Classification Search
USPC ........................................ 438/478
See application file for complete search history.

(56) References Cited

U.S. PATENT DOCUMENTS

| | | | |
|---|---|---|---|
| 4,599,705 A | 7/1986 | Holmberg et al. | |
| 5,406,509 A | 4/1995 | Ovshinsky et al. | |
| 5,687,112 A | 11/1997 | Ovshinsky | |
| 5,751,012 A | 5/1998 | Wolstenholme et al. | |
| 5,825,046 A | 10/1998 | Czubatyj et al. | |
| 5,831,276 A | 11/1998 | Gonzalez et al. | |
| 5,915,167 A | 6/1999 | Leedy | |
| 5,952,671 A | 9/1999 | Reinberg et al. | |
| 6,071,597 A | 6/2000 | Yang et al. | |
| 6,100,193 A | 8/2000 | Suehiro et al. | |
| 6,114,713 A | 9/2000 | Zahorik | |
| 6,214,107 B1 | 4/2001 | Kitabatake | |
| 6,369,431 B1 | 4/2002 | Gonzalez et al. | |
| 6,388,933 B2 | 5/2002 | Marr | |
| 6,563,220 B2 | 5/2003 | Gonzalez et al. | |
| 6,643,159 B2 | 11/2003 | Fricke et al. | |
| 6,670,713 B2 | 12/2003 | Gonzalez et al. | |
| 6,744,088 B1 | 6/2004 | Dennison | |
| 6,841,846 B1 | 1/2005 | Chen et al. | |
| 6,885,021 B2 | 4/2005 | Apodaca et al. | |
| 6,937,507 B2 | 8/2005 | Chen | |
| 6,952,030 B2 | 10/2005 | Herner | |
| 6,960,495 B2 | 11/2005 | Vyvoda et al. | |

(Continued)

FOREIGN PATENT DOCUMENTS

| | | |
|---|---|---|
| EP | 0 028 707 | 5/1981 |
| EP | 1 892 722 | 2/2008 |

(Continued)

OTHER PUBLICATIONS

Li et al., "Electronic Two-Terminal Bistable Graphitic Memories", Nature Materials, vol. 7, 2008, pp. 966-971.

(Continued)

*Primary Examiner* — Thanh Nguyen
(74) *Attorney, Agent, or Firm* — Dugan & Dugan, PC

(57) ABSTRACT

A method of forming a reversible resistance-switching metal-insulator-metal structure is provided, the method including forming a first non-metallic conducting layer, forming a non-conducting layer above the first non-metallic conducting layer, forming a second non-metallic conducting layer above the non-conducting layer, etching the first non-metallic conducting layer, non-conducting layer and second non-metallic conducting layer to form a pillar, and disposing a carbon material layer about a sidewall of the pillar. Other aspects are also provided.

16 Claims, 17 Drawing Sheets

(56) References Cited

U.S. PATENT DOCUMENTS

| | | |
|---|---|---|
| 6,984,561 B2 | 1/2006 | Herner et al. |
| 6,995,422 B2 | 2/2006 | Herner et al. |
| 7,009,275 B2 | 3/2006 | Herner et al. |
| 7,026,212 B2 | 4/2006 | Herner et al. |
| 7,084,062 B1 | 8/2006 | Avanzino et al. |
| 7,176,064 B2 | 2/2007 | Herner |
| 7,205,562 B2 | 4/2007 | Wicker |
| 7,238,607 B2 | 7/2007 | Dunton et al. |
| 7,259,038 B2 | 8/2007 | Scheuerlein et al. |
| 7,265,049 B2 | 9/2007 | Herner et al. |
| 7,271,440 B2 | 9/2007 | Harshfield |
| 7,285,464 B2 | 10/2007 | Herner et al. |
| 7,301,191 B1 | 11/2007 | Tombler et al. |
| 7,345,296 B2 | 3/2008 | Tombler, Jr. et al. |
| 7,361,586 B2 | 4/2008 | Adem et al. |
| 7,405,465 B2 | 7/2008 | Herner |
| 7,417,245 B2 | 8/2008 | Happ et al. |
| 7,426,128 B2 | 9/2008 | Scheuerlein |
| 7,483,285 B2 | 1/2009 | Furukawa et al. |
| 7,575,984 B2 | 8/2009 | Radigan |
| 7,602,042 B2 | 10/2009 | Ahn et al. |
| 7,705,343 B2 | 4/2010 | Suh et al. |
| 7,728,405 B2 | 6/2010 | Kreupl |
| 7,830,698 B2 | 11/2010 | Chen et al. |
| 7,955,981 B2 | 6/2011 | Chen et al. |
| 8,023,310 B2 | 9/2011 | Fu et al. |
| 8,039,919 B2 | 10/2011 | Moon et al. |
| 8,093,123 B2 | 1/2012 | Xu et al. |
| 8,114,765 B2 | 2/2012 | Xu et al. |
| 8,206,995 B2 | 6/2012 | Reyes et al. |
| 2003/0073295 A1 | 4/2003 | Xu |
| 2004/0159835 A1 | 8/2004 | Krieger et al. |
| 2004/0251551 A1 | 12/2004 | Hideki |
| 2005/0052915 A1 | 3/2005 | Herner et al. |
| 2005/0158950 A1 | 7/2005 | Scheuerlein et al. |
| 2005/0226067 A1 | 10/2005 | Herner et al. |
| 2006/0046407 A1 | 3/2006 | Juengling |
| 2006/0097342 A1 | 5/2006 | Parkinson |
| 2006/0118782 A1 | 6/2006 | Zettl et al. |
| 2006/0175596 A1 | 8/2006 | Happ et al. |
| 2006/0250836 A1 | 11/2006 | Herner et al. |
| 2006/0258109 A1 | 11/2006 | Juengling |
| 2006/0273298 A1 | 12/2006 | Petti |
| 2007/0034936 A1* | 2/2007 | Van Schaijk et al. ......... 257/315 |
| 2007/0123053 A1 | 5/2007 | Kim et al. |
| 2007/0190722 A1 | 8/2007 | Herner |
| 2008/0017894 A1 | 1/2008 | Happ et al. |
| 2008/0070162 A1 | 3/2008 | Ufert |
| 2008/0116441 A1 | 5/2008 | Raghuram |
| 2008/0173858 A1 | 7/2008 | An et al. |
| 2008/0217732 A1 | 9/2008 | Kreupl |
| 2009/0108368 A1* | 4/2009 | Kanegae et al. ............. 257/369 |
| 2009/0168491 A1 | 7/2009 | Schricker et al. |
| 2009/0201715 A1 | 8/2009 | Kreupl |
| 2009/0257265 A1 | 10/2009 | Chen et al. |
| 2009/0257270 A1 | 10/2009 | Schricker et al. |
| 2009/0262572 A1 | 10/2009 | Krusin-Elbaum |
| 2009/0294832 A1* | 12/2009 | Kakoschke et al. ........... 257/324 |
| 2010/0006811 A1 | 1/2010 | Xu et al. |
| 2010/0006812 A1 | 1/2010 | Xu |
| 2010/0012914 A1 | 1/2010 | Xu et al. |
| 2010/0032638 A1 | 2/2010 | Xu |
| 2010/0032639 A1 | 2/2010 | Xu |
| 2010/0032640 A1 | 2/2010 | Xu |
| 2010/0032643 A1 | 2/2010 | Xu |
| 2010/0038620 A1 | 2/2010 | Xu et al. |
| 2010/0038623 A1 | 2/2010 | Xu et al. |
| 2010/0059730 A1* | 3/2010 | Ito et al. ..................... 257/2 |
| 2010/0081268 A1 | 4/2010 | Schricker et al. |
| 2010/0102291 A1 | 4/2010 | Xu |
| 2010/0108976 A1 | 5/2010 | Jayasekara et al. |
| 2010/0108982 A1 | 5/2010 | Ping et al. |
| 2010/0163824 A1 | 7/2010 | Xu et al. |
| 2010/0176366 A1 | 7/2010 | Fu et al. |
| 2010/0193916 A1 | 8/2010 | Xu et al. |
| 2010/0291747 A1 | 11/2010 | Lung et al. |
| 2010/0327254 A1 | 12/2010 | Chen et al. |
| 2011/0037045 A1 | 2/2011 | Fukumizu et al. |
| 2011/0117679 A1* | 5/2011 | Lee et al. .................... 438/5 |
| 2011/0204313 A1 | 8/2011 | Chen et al. |
| 2011/0278529 A1 | 11/2011 | Xu |
| 2012/0135603 A1 | 5/2012 | Xu et al. |

FOREIGN PATENT DOCUMENTS

| | | |
|---|---|---|
| EP | 1 916 722 | 4/2008 |
| JP | 2009 218259 | 9/2009 |
| WO | WO 2004/070735 | 8/2004 |
| WO | WO 2006/078505 A2 | 7/2006 |
| WO | WO 2008/078197 | 7/2008 |
| WO | WO 2009/043023 A2 | 4/2009 |
| WO | WO 2009/088889 | 7/2009 |
| WO | WO 2009/110120 | 9/2009 |
| WO | WO 2009/126846 | 10/2009 |
| WO | WO 2009/126891 | 10/2009 |
| WO | WO 2010/017428 | 2/2010 |

OTHER PUBLICATIONS

Maxwell, U.S. Appl. No. 12/703,907, filed Feb. 11, 2010.
Franz Kreupl et al., U.S. Appl. No. 12/711,810, filed Feb. 24, 2010.
Li et al., U.S. Appl. No. 12/714,359, filed Feb. 26, 2010.
Kreupl et al., "Carbon-Based Resistive Memory", Jun. 26, 2008, IEDM 2008, pp. 1-4.
Gateru et al., "Memory Switching in Ion Bombarded Amorphous Silicon Carbide Thin Film Devices", 2003, Materials Research Society, Mat. Res. Soc. Symp. Proc., vol. 742, pp. 79-83.
Shannon et al., "Memory Switching in Amorphous Silicon-Rich Silicon Carbide", Oct. 28, 1999, Electronics Letters, vol. 35, No. 22, pp. 1976-1978.
Kreupl et al., U.S. Appl. No. 12/760,156, filed Apr. 14, 2010.
Sin, C-Y et al., "Resist trimming in high-density CF 4/02 Plasmas for sub-0.1 [mu]m device fabrication", Jour. Vacuum Sci. & Techno. B (Microelectronics and Nanometer Structures) AIP for American Vacuum Soc. USA, vol. 20, No. 5, pp. 1974-1981, 2002.
Eyoum, M-A et al., "Ashing Technique for Nano-Gap Fabrication of Electrostatic Transducers", Materials Research Society Symposium Proceedings; [Materials Research Society Symposium Proceedings], Materials Research Society, USA, vol. EXS-02, pp. 145-147, 2003.
Gerstner et al., "Nonvolatile Memory Effects in Nitrogen Doped Tetrahedral Amorphous Carbon Thin Films", Nov. 15, 1998, Journal of Applied Physics, vol. 84, No. 10, pp. 5647-5651.
Takai et al.,"Structure and Electronic Properties of a Nongraphitic Disordered Carbon System and its Heat-Treatment Effects", Physical Review B 67, 214202, pp. 214202-1-214202-11, published Jun. 19, 2003.
Bhattacharyya, et al., "Resonant Tunnelling and Fast Switching in Amorphous-Carbon Quantum-Well Structures," Dec. 2005, Nanoelectronics Centre, Advanced Technology Institute, pp. 19-22.
Dittmer et al., "Low ambient temperature CVD growth of carbon nanotubes," Appl. Phys. A 84,243-246 (2006), p. 1, published online May 17, 2006.
Kodama et al., "Properties of Amorphous Carbon Films Synthesized by Atmospheric Pressure Glow Plasma CVD Method," Journal of Photopolymer Science and Technology, vol. 19, No. 5, 2006, pp. 673-678, Received Jun. 14, 2006.
Kong et al., "Integration of a gate electrode into carbon nanotube devices for scanning tunneling microscopy," Appl. Phys. Lett. 86, 2005, pp. 112106-1-112106-3, published online Mar. 8, 2005.
Bhattacharyya, et al., "Switching behaviour and high frequency response of amorphous carbon double-barrier structures", Aug. 2007, Materials Science and Engineering C, Elsevier Science S.A, CH, vol. 27 No. 5-8, pp. 957-960, available online Nov. 13, 2006.
Xu et al., U.S. Appl. No. 12/834,942, filed Jul. 13, 2010.
Xu et al., U.S. Appl. No. 112/835,236, filed Jul. 13, 2010.

* cited by examiner ics, and more
METHODS OF FORMING A REVERSIBLE RESISTANCE-SWITCHING METAL-INSULATOR-METAL STRUCTURE

TECHNICAL FIELD

This invention relates to non-volatile memories, and more particularly to a memory cell that includes a carbon-based memory element, and methods of forming the same.

BACKGROUND

Non-volatile memories formed from reversible resistance switching elements are known. For example, U.S. patent application Ser. No. 11/968,154, filed Dec. 31, 2007, and titled "Memory Cell That Employs A Selectively Fabricated Carbon Nano-Tube Reversible Resistance Switching Element And Methods Of Forming The Same," (the "'154 Application"), which is incorporated by reference herein in its entirety for all purposes, describes a rewriteable non-volatile memory cell that includes a diode coupled in series with a carbon-based reversible resistivity switching material.

However, fabricating memory devices from carbon-based materials is technically challenging, and improved methods of forming memory devices that employ carbon-based materials are desirable.

SUMMARY

In a first aspect of the invention, a method of forming a reversible resistance-switching metal-insulator-metal ("MIM") structure is provided, the method including forming a first non-metallic conducting layer, forming a non-conducting layer above the first non-metallic conducting layer, forming a second non-metallic conducting layer above the non-conducting layer, etching the first non-metallic conducting layer, non-conducting layer and second non-metallic conducting layer to form a pillar, and disposing a carbon material layer about a sidewall of the pillar.

In a second aspect of the invention, a method of forming a memory cell is provided, the method including forming a first conductor, forming a pillar above the first conductor, the pillar including a first non-metallic conducting layer, a non-conducting layer above the first non-metallic conducting layer, and a second non-metallic conducting layer above the non-conducting layer, forming a carbon element about a sidewall of the pillar, and forming a second conductor above the pillar.

In a third aspect of the invention, a memory cell is provide, the memory cell including a pillar including a substantially non-conducting layer disposed between a first non-metallic conducting layer and a second non-metallic conducting layer, and a reversible resistance-switching element disposed about a peripheral sidewall of the pillar, and coupled to the first non-metallic conducting layer and the second non-metallic conducting layer.

Other features and aspects of the present invention will become more fully apparent from the following detailed description, the appended claims and the accompanying drawings.

BRIEF DESCRIPTION OF THE DRAWINGS

Features of the present invention can be more clearly understood from the following detailed description considered in conjunction with the following drawings, in which the same reference numerals denote the same elements throughout, and in which.

DETAILED DESCRIPTION

Figure 1:
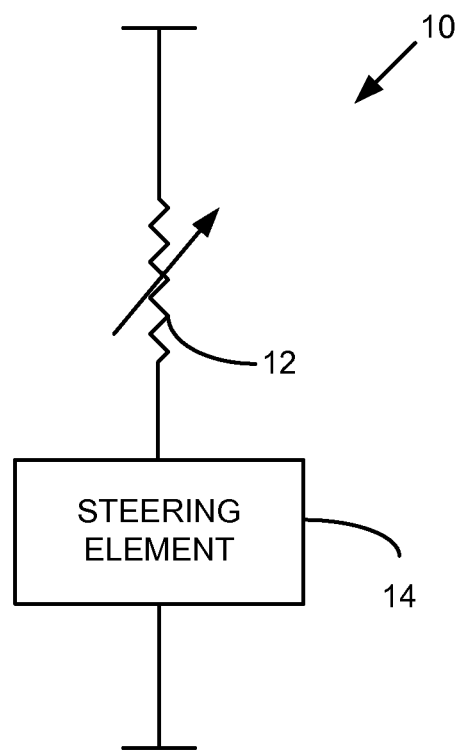
FIG. 1 is a diagram of an exemplary memory cell in accordance with this invention.

Carbon films such as amorphous carbon ("aC") containing nanocrystalline graphene (referred to herein as "graphitic carbon"), graphene, graphite, carbon nano-tubes, amorphous diamond-like carbon ("DLC"), silicon carbide, boron carbide and other similar carbon-based materials may exhibit resistivity-switching behavior that may make such materials suitable for use in microelectronic non-volatile memories. Indeed, some carbon-based materials have demonstrated reversible resistivity-switching memory properties on lab-scale devices with a 100× separation between ON and OFF states and mid-to-high range resistance changes. Such a separation between ON and OFF states renders carbon-based materials viable candidates for memory cells formed using the carbon materials in memory elements. As used herein, DLC is a carbon material that tends to have primarily tetrahedral carbon-carbon single bonds (often called $sp^3$-bonds), and tends to be amorphous with respect to long range order.

A carbon-based memory element may be formed by arranging a carbon-based resistivity-switching material between bottom and top electrodes to form a MIM structure. In such a configuration, the carbon-based resistivity-switching material sandwiched between the two metal or otherwise conducting layers serves as a carbon-based reversible resistance-switching element. A memory cell may then be formed by coupling the MIM structure in series with a steering element, such as a diode, tunnel junction, thin film transistor, or the like.

Attempts to integrate carbon-based material using traditional semiconductor processing techniques, however, have proven technically challenging. In particular, some carbon-based resistivity-switching materials are porous. As a result, if a MIM is created by disposing a carbon-based resistivity-switching material between two metal electrodes, metal atoms in the electrodes may undesirably penetrate the porous carbon-based resistivity-switching material, and may create a short circuit across the carbon-based switching material.

In accordance with embodiments of this invention, a MIM is provided that includes a carbon-based reversible resistance-switching element disposed about a peripheral sidewall of a pillar that includes a non-conducting layer disposed between first and second non-metallic conducting layers. A memory cell may then be formed by coupling the MIM in series with a steering element, such as a diode, tunnel junction, thin film transistor, or the like.

Although not wanting to be bound by any particular theory, it is believed that current flowing through the MIM flows substantially through the first non-metallic conducting layer, the portion of the carbon-based reversible resistance-switching element disposed about the non-conducting layer, and the second non-metallic conducting layer. Due to the structure of the memory cell, penetration of metal atoms into the carbon-based reversible resistance switching element is reduced or eliminated.

Exemplary Inventive Memory Cell

FIG. 1 is a schematic illustration of an exemplary memory cell 10 in accordance with this invention. Memory cell 10 includes a carbon-based reversible resistance-switching element 12 coupled to a steering element 14. Carbon-based reversible resistance-switching element 12 includes a carbon-based reversible resistivity-switching material (not separately shown) having a resistivity that may be reversibly switched between two or more states.

For example, carbon-based reversible resistance-switching material of element 12 may be in an initial, low-resistivity state upon fabrication. Upon application of a first voltage and/or current, the material is switchable to a high-resistivity state. Application of a second voltage and/or current may return reversible resistivity switching material to a low-resistivity state. Alternatively, carbon-based reversible resistance-switching element 12 may be in an initial, high-resistance state upon fabrication that is reversibly switchable to a low-resistance state upon application of the appropriate voltage(s) and/or current(s). When used in a memory cell, one resistance state may represent a binary "0," whereas another resistance state may represent a binary "1," although more than two data/resistance states may be used. Numerous reversible resistivity switching materials and operation of memory cells employing reversible resistance switching elements are described, for example, in U.S. patent application Ser. No. 11/125,939, filed May 9, 2005, and titled "Rewriteable Memory Cell Comprising A Diode And A Resistance Switching Material," (the "'939 Application"), which is incorporated by reference herein in its entirety for all purposes.

Steering element 14 may include a thin film transistor, a diode, metal-insulator-metal tunneling current device, or another similar steering element that exhibits non-ohmic conduction by selectively limiting the voltage across and/or the current flow through carbon-based reversible resistance-switching element 12. In this manner, memory cell 10 may be used as part of a two or three dimensional memory array and data may be written to and/or read from memory cell 10 without affecting the state of other memory cells in the array.

Exemplary embodiments of memory cell 10, carbon-based reversible resistance-switching element 12 and steering element 14 are described below with reference to FIGS. 2A-2D and FIGS. 3A-3C.

Exemplary Embodiments of Memory Cells and Memory Arrays

Figure 2A:
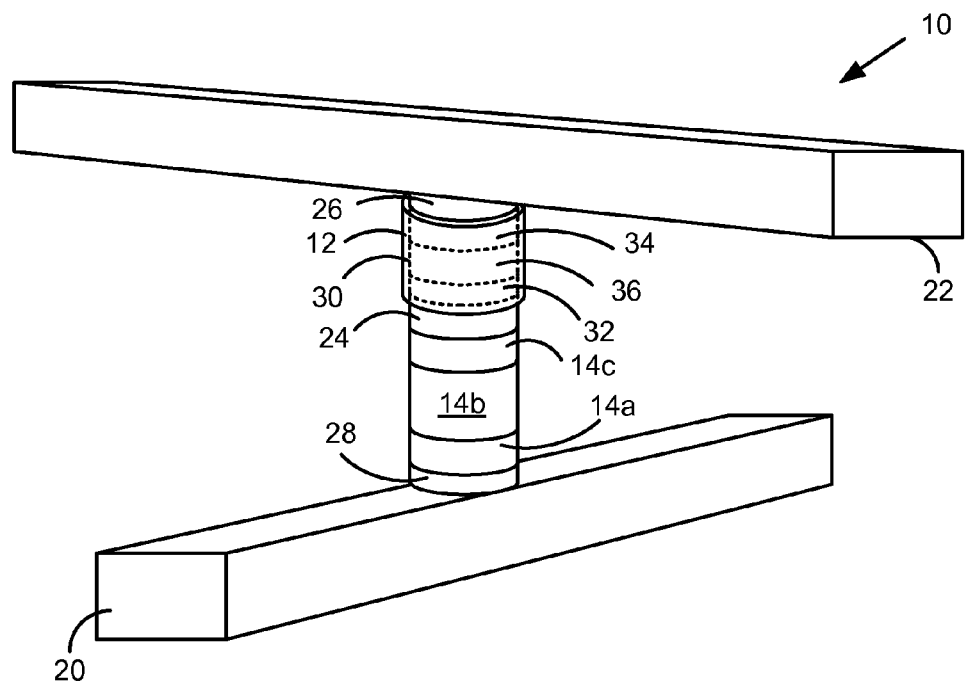
FIG. 2A is a simplified perspective view of an exemplary memory cell in accordance with this invention.

FIG. 2A is a simplified perspective view of an exemplary embodiment of a memory cell 10 in accordance with this invention. Memory cell 10 includes a carbon-based reversible resistance-switching element 12 disposed about a peripheral sidewall of a pillar 30, which is coupled in series with a steering element 14. In some embodiments, carbon-based reversible resistance switching element 12 and pillar 30 may be positioned below steering element 14. In some embodiments, steering element 14 may be omitted, and memory cell 10 may be used with a remotely located steering element.

In some embodiments, a barrier layer 24 may be formed between pillar 30 and steering element 14, a barrier layer 26 may be formed between pillar 30 and second conductor 22, and a barrier layer 28 may be formed between steering element 14 and first conductor 20. Barrier layers 24, 26, and 28 may include titanium nitride, tantalum nitride, tungsten nitride, tungsten, molybdenum, or other similar barrier layer material. In some embodiments, barrier layer 26 may be formed as part of second conductor 22.

Steering element 14 may include a thin film transistor, a diode, a metal-insulator-metal tunneling current device, or another similar steering element that exhibits non-ohmic conduction by selectively limiting the voltage across and/or the current flow through carbon-based reversible resistance switching element 12. In the example of FIG. 2A, steering element 14 is a diode. Accordingly, steering element 14 is sometimes referred to herein as "diode 14."

Diode 14 may include any suitable diode such as a vertical polycrystalline p-n or p-i-n diode, whether upward pointing with an n-region above a p-region of the diode or downward pointing with a p-region above an n-region of the diode. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above the intrinsic region 14b. It will be understood that the locations of the n+ and p+ regions may be reversed. Exemplary embodiments of diode 14 are described below with reference to FIGS. 3A-3C.

In the exemplary embodiment of FIG. 2A, pillar 30 is a vertically-oriented structure that includes a first non-metallic conducting layer 32, a second non-metallic conducting layer 34, and a non-conducting layer 36 disposed between first non-metallic conducting layer 32 and second non-metallic conducting layer 34. In the illustrated embodiment, pillar 30 has a diameter substantially the same as the diameter of diode 14. Persons of ordinary skill in the art will understand that pillar 30 alternatively may have a diameter larger or smaller than the diameter of diode 14, and may have an orientation other than vertical.

First and second non-metallic conducting layers 32 and 34 may include a highly doped semiconductor material (e.g., silicon, germanium, silicon-germanium or other similar semiconductor material), or other similar non-metallic conducting material (e.g., highly-doped silicon carbide ("SiC"), tantalum carbide ("TaC"), tungsten carbide ("WC"), or other similar material). As used herein, a "non-metallic conducting material" means a conductive material that does not substantially comprise a metal. Non-conducting layer 36 may include a substantially non-conducting material, such as silicon dioxide ("SiO$_2$"), aluminum oxide ("Al$_2$O$_3$"), hafnium dioxide ("HfO$_2$"), magnesium oxide ("MgO"), zirconium oxide ("ZrO"), silicon nitride ("Si$_3$N$_4$"), boron nitride ("BN"), aluminum nitride ("AlN"), or other similar substantially non-conducting material.

As previously discussed, carbon-based reversible resistance switching element 12 is disposed about a peripheral sidewall of pillar 30. In exemplary embodiments of this invention, carbon-based reversible resistance switching element 12 may include graphitic carbon. For example, in some embodiments, graphitic carbon reversible resistivity switching materials may be formed as described in U.S. patent application Ser. No. 12/499,467, filed Jul. 8, 2009 and titled "Carbon-Based Resistivity-Switching Materials And Methods Of Forming The Same" (the "'467 application"), which is hereby incorporated by reference herein in its entirety for all purposes. In other embodiments, carbon-based reversible resistance switching element 12 may include other carbon-based materials such as graphene, graphite, carbon nano-tube materials, DLC, silicon carbide, boron carbide, or other similar carbon-based materials. First non-metallic conducting layer 32, carbon-based reversible resistance-switching element 12, and second non-metallic conducting layer 34 form a MIM structure, with first non-metallic conducting layer 32 and second non-metallic conducting layer 34 forming the bottom and top electrodes, respectively, of the MIM structure.

First conductor 20 and/or second conductor 22 may include any suitable conductive material such as tungsten, any appropriate metal, heavily doped semiconductor material, a conductive silicide, a conductive silicide-germanide, a conductive germanide, or the like. In the embodiment of FIG. 2A, first and second conductors 20 and 22, respectively, are rail-shaped and extend in different directions (e.g., substantially perpendicular to one another). Other conductor shapes and/or configurations may be used. In some embodiments, barrier layers, adhesion layers, antireflection coatings and/or the like (not shown) may be used with the first conductor 20 and/or second conductor 22 to improve device performance and/or aid in device fabrication.

Figure 2B:
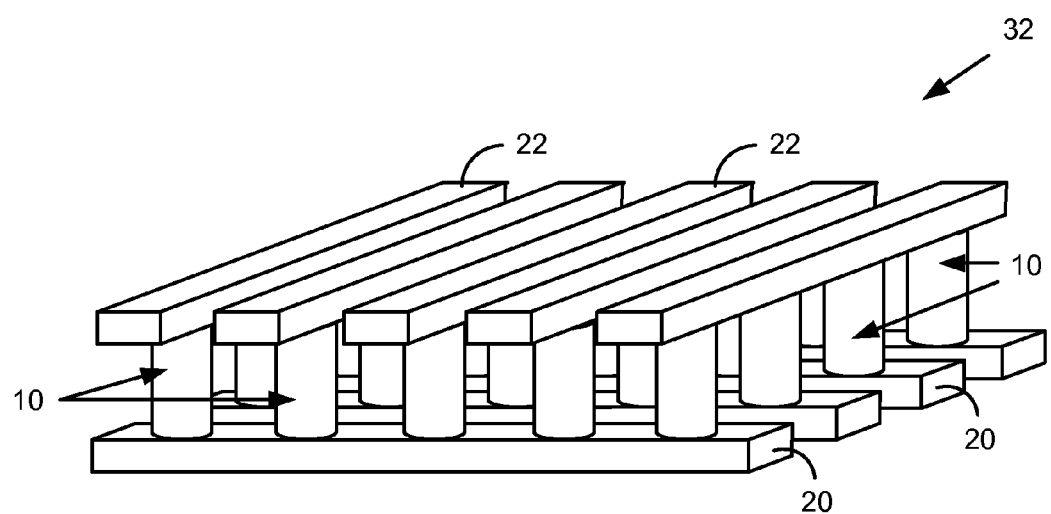
FIG. 2B is a simplified perspective view of a portion of a first exemplary memory level in accordance with this invention.

FIG. 2B is a simplified perspective view of a portion of a first memory level 32 formed from a plurality of memory cells 10, such as memory cell 10 of FIG. 2A. For simplicity, reversible resistance switching element 12, steering element 14, and barrier layers 24, 26, and 28 are not separately shown. Memory level 32 is a "cross-point" array including a plurality of bit lines (second conductors 22) and word lines (first conductors 20) to which multiple memory cells are coupled (as shown). Other memory array configurations may be used, as may multiple levels of memory.

Figure 2C:
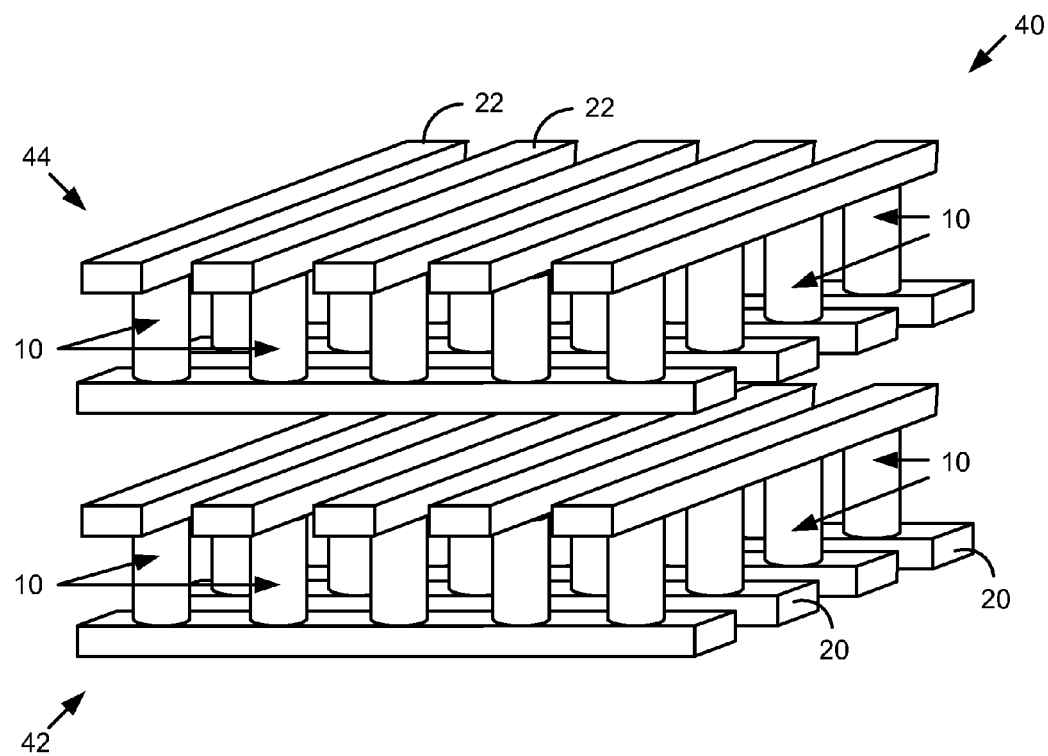
FIG. 2C is a simplified perspective view of a portion of a first exemplary three-dimensional memory array in accordance with this invention.

For example, FIG. 2C is a simplified perspective view of a portion of a monolithic three dimensional array 40a that includes a first memory level 42 positioned below a second memory level 44. Memory levels 42 and 44 each include a plurality of memory cells 10 in a cross-point array. Persons of ordinary skill in the art will understand that additional layers (e.g., an interlevel dielectric) may be present between the first and second memory levels 42 and 44, but are not shown in FIG. 2C for simplicity. Other memory array configurations may be used, as may additional levels of memory. In the embodiment of FIG. 2C, all diodes may "point" in the same direction, such as upward or downward depending on whether p-i-n diodes having a p-doped region on the bottom or top of the diodes are employed, simplifying diode fabrication.

Figure 2D:
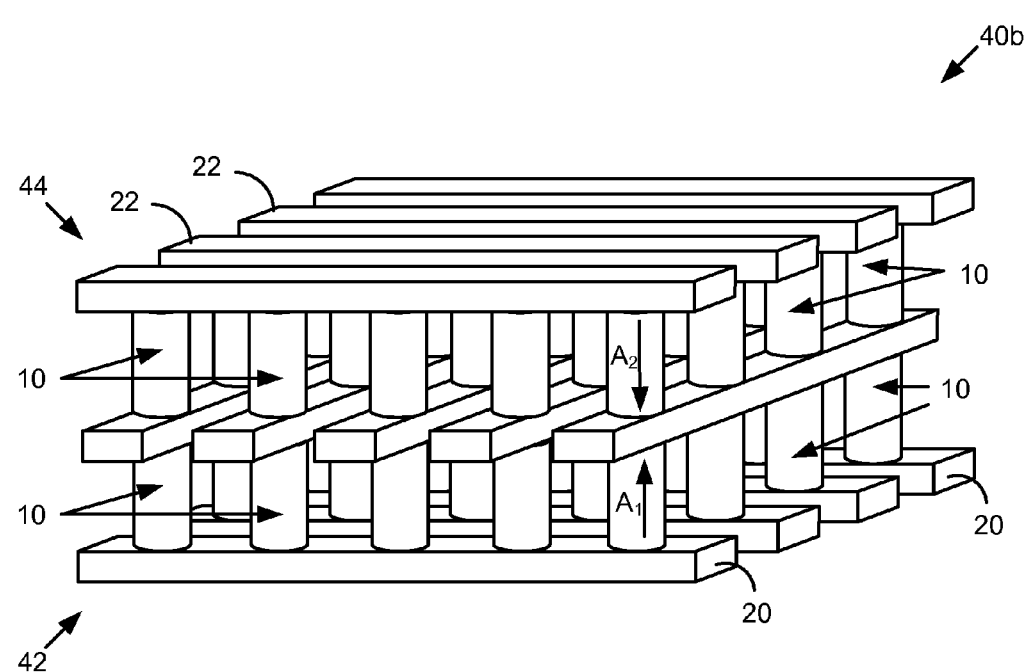
FIG. 2D is a simplified perspective view of a portion of a second exemplary three-dimensional memory array in accordance with this invention.

For example, in some embodiments, the memory levels may be formed as described in U.S. Pat. No. 6,952,030, titled "High-Density Three-Dimensional Memory Cell," which is hereby incorporated by reference herein in its entirety for all purposes. For instance, the upper conductors of a first memory level may be used as the lower conductors of a second memory level that is positioned above the first memory level as shown in FIG. 2D. In such embodiments, the diodes on adjacent memory levels preferably point in opposite directions as described in U.S. patent application Ser. No. 11/692,151, filed Mar. 27, 2007, and titled "Large Array Of Upward Pointing P-I-N Diodes Having Large And Uniform Current," (the "'151 Application"), which is hereby incorporated by reference herein in its entirety for all purposes. For example, as shown in FIG. 2D, the diodes of the first memory level 42 may be upward pointing diodes as indicated by arrow A2 (e.g., with p regions at the bottom of the diodes), whereas the diodes of the second memory level 44 may be downward pointing diodes as indicated by arrow A2 (e.g., with n regions at the bottom of the diodes), or vice versa.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, titled "Three Dimensional Structure Memory." The substrates may be thinned or removed from the memory levels before bonding, but as the memory levels are initially formed over separate substrates, such memories are not true monolithic three dimensional memory arrays.

Figure 3A:
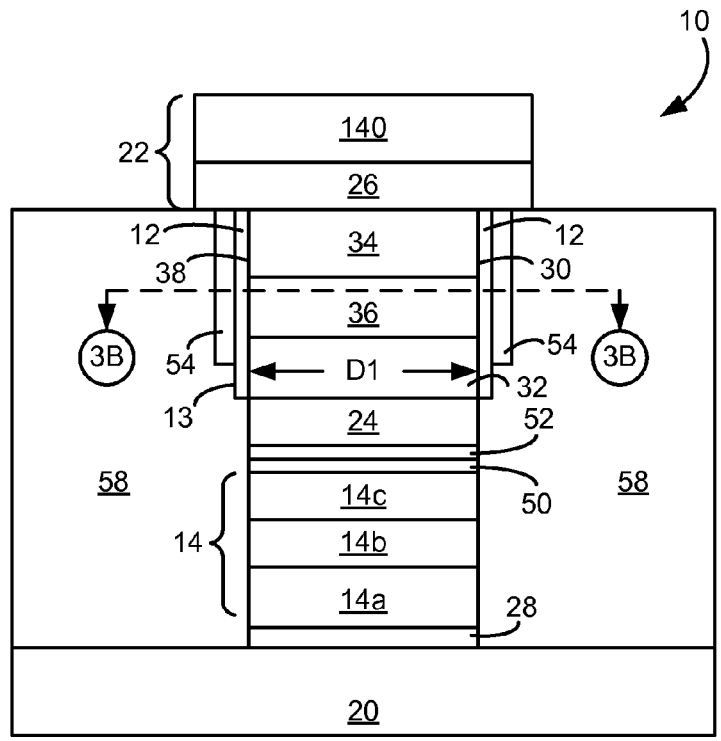
FIG. 3A is a cross-sectional view of an exemplary memory cell in accordance with this invention.
Figure 3B:
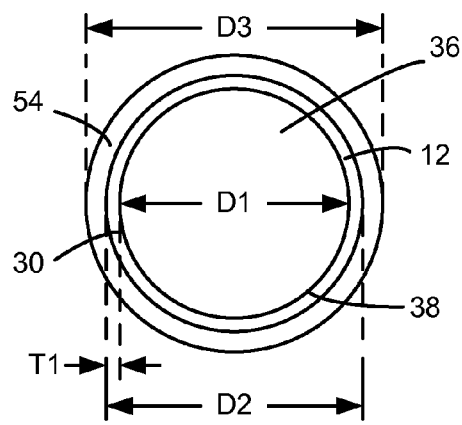
FIG. 3B is a cross-sectional view as indicated by line 3B-3B shown in FIG. 3A.
Figure 3C:
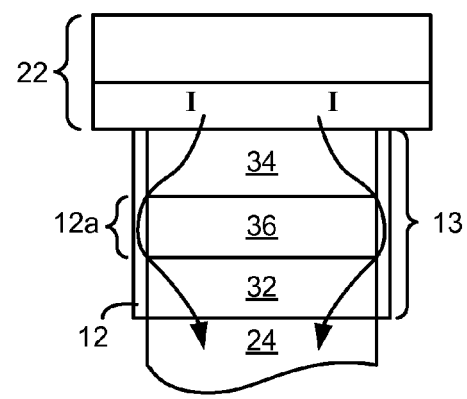
FIG. 3C is a partial cross-sectional view of the exemplary memory cell of FIG. 3A.

FIGS. 3A-3C illustrate cross-sectional views of an exemplary embodiment of memory cell 10 of FIG. 2A formed on a substrate, such as a wafer (not shown). With reference to FIG. 3A, memory cell 10 includes carbon-based reversible resistance switching element 12, pillar 30 and diode 14 coupled between first and second conductors 20 and 22, respectively. Memory cell 10 may also include barrier layers 26, 28 and 24, a sidewall liner 54, a silicide layer 50, a silicide-forming metal layer 52, and dielectric layer 58, as well as adhesion layers, antireflective coating layers and/or the like (not shown) which may be used with first and/or second conductors 20 and 22, respectively, to improve device performance and/or facilitate device fabrication.

First conductor 20 may include any suitable conductive material such as tungsten, any appropriate metal, heavily doped semiconductor material, a conductive silicide, a conductive silicide-germanide, a conductive germanide, or the like. Second conductor 22 includes a barrier layer 26, which may include titanium nitride or other similar barrier layer material, and conductive layer 140, which may include any suitable conductive material such as tungsten, any appropriate metal, heavily doped semiconductor material, a conductive silicide, a conductive silicide-germanide, a conductive germanide, or the like.

Diode 14 may be a vertical p-n or p-i-n diode, which may either point upward or downward. In the embodiment of FIG. 2D in which adjacent memory levels share conductors, adjacent memory levels preferably have diodes that point in opposite directions such as downward-pointing p-i-n diodes for a first memory level and upward-pointing p-i-n diodes for an adjacent, second memory level (or vice versa).

In some embodiments, diode 14 may be formed from a polycrystalline semiconductor material such as polysilicon, a polycrystalline silicon-germanium alloy, polygermanium or any other suitable material. For example, diode 14 may include a heavily doped n+ polysilicon region 14a, a lightly doped or an intrinsic (unintentionally doped) polysilicon region 14b above the n+ polysilicon region 14a, and a heavily doped p+ polysilicon region 14c above intrinsic region 14b. It will be understood that the locations of the n+ and p+ regions may be reversed.

In some embodiments, a thin germanium and/or silicon-germanium alloy layer (not shown) may be formed on n+ polysilicon region 14a to prevent and/or reduce dopant migration from n+ polysilicon region 14a into intrinsic region 14b. Use of such a layer is described, for example, in U.S. patent application Ser. No. 11/298,331, filed Dec. 9, 2005 and titled "Deposited Semiconductor Structure To Minimize N-Type Dopant Diffusion And Method Of Making" (the "'331 Application"), which is hereby incorporated by reference herein in its entirety for all purposes. In some embodiments, a few hundred angstroms or less of silicon-germanium alloy with about ten atomic percent or more of germanium may be employed.

If diode 14 is fabricated from deposited silicon (e.g., amorphous or polycrystalline), a silicide layer 50 may be formed on diode 14 to place the deposited silicon in a low resistivity state, as fabricated. Such a low resistivity state allows for easier programming of memory cell 10 as a large voltage is not required to switch the deposited silicon to a low resistivity state. For example, a silicide-forming metal layer 52 such as titanium or cobalt may be deposited on p+ polysilicon region 14c. In some embodiments, an additional nitride layer (not shown) may be formed at a top surface of silicide-forming metal layer 52. In particular, for highly reactive metals, such as titanium, an additional cap layer such as TiN layer may be formed on silicide-forming metal layer 52. Thus, in such embodiments, a Ti/TiN stack is formed on top of p+ polysilicon region 14c.

A rapid thermal anneal ("RTA") step may then be performed to form silicide regions by reaction of silicide-forming metal layer 52 with p+ region 14c. The RTA step may be performed at a temperature between about 650° C. and about 750° C., more generally between about 600° C. and about 800° C., preferably at about 750° C., for a duration between about 10 seconds and about 60 seconds, more generally between about 10 seconds and about 90 seconds, preferably about 1 minute, and causes silicide-forming metal layer 52 and the deposited silicon of diode 14 to interact to form silicide layer 50, consuming all or a portion of the silicide-forming metal layer 52.

As described in U.S. Pat. No. 7,176,064, titled "Memory Cell Comprising A Semiconductor Junction Diode Crystallized Adjacent To A Silicide," which is incorporated by reference herein in its entirety for all purposes, silicide-forming materials such as titanium and/or cobalt react with deposited silicon during annealing to form a silicide layer. The lattice spacing of titanium silicide and cobalt silicide are close to that of silicon, and it appears that such silicide layers may serve as "crystallization templates" or "seeds" for adjacent deposited silicon as the deposited silicon crystallizes (e.g., silicide layer 50 enhances the crystalline structure of silicon diode 14 during annealing). Lower resistivity silicon thereby is provided. Similar results may be achieved for silicon-germanium alloy and/or germanium diodes.

In embodiments in which a nitride layer was formed at a top surface of silicide-forming metal layer 52, following the RTA step, the nitride layer may be stripped using a wet chemistry. For example, if silicide-forming metal layer 52 includes a TiN top layer, a wet chemistry (e.g., $H_2O:H_2O_2:NR_4OH$ in a 10:2:1 ratio at a temperature of between about 40-60° C.) may be used to strip any residual TiN.

A barrier layer 28, such as TiN, TaN, WN, W, molybdenum, or other similar material, may be formed between first conductor 20 and n+ region 14a (e.g., to prevent and/or reduce migration of metal atoms into the polysilicon regions). In some embodiments, barrier layer 28 may be TiN with a thickness of between about 100 to 2000 angstroms, although other materials and/or thicknesses may be used.

Similarly, a barrier layer 24, such as TiN, TaN, WN, W, molybdenum, or other similar material, may be formed between diode 14 and pillar 30. In some embodiments, barrier layer 24 may be TiN with a thickness of between about 100 to 2000 angstroms, although other materials and/or thicknesses may be used.

Conductor 22 may include a barrier layer 26, such as TiN, TaN, WN, W, molybdenum, or other similar material. In some embodiments, barrier layer 26 may be TiN with a thickness between about 100 to 2000 angstroms, although other materials and/or thicknesses may be used.

As shown in FIG. 3A, pillar 30 includes non-conducting layer 36 disposed between first non-metallic conducting layer 32 and second non-metallic conducting layer 34. Pillar 30 may have a diameter D1 substantially the same as the diameter of diode 14. In some embodiments, pillar 30 has a diameter D1 between about 300 angstroms and about 1500 angstroms, more generally between about 200 angstroms and about 5000 angstroms. Persons of ordinary skill in the art will understand, however, that pillar 30 may have a diameter D1 larger or smaller than the diameter of diode 14.

First and second non-metallic conducting layers 32 and 34 may include a highly doped semiconductor material (e.g., silicon, germanium, silicon-germanium or other similar semiconductor material), or other similar non-metallic conducting material (e.g., highly-doped SiC, TaC, WC, or other similar material). First and second non-metallic conducting layers 32 and 34 may be formed from the same material or different materials. For example, first non-metallic conducting layer 32 may be formed from highly doped silicon, and second non-metallic conducting layer 34 may be formed from highly doped TaC.

In an exemplary embodiment, first and second non-metallic conducting layers 32 and 34 may include heavily doped silicon. In some embodiments, first and second non-metallic conducting layers 32 and 34 include heavily doped n+ silicon which is deposited in an amorphous state and then doped. In other embodiments, first and second non-metallic conducting layers 32 and 34 may include n+ silicon which is deposited in a polycrystalline state and then doped.

CVD or another suitable process may be employed to deposit first and second non-metallic conducting layers 32 and 34. In at least one embodiment, first and second non-metallic conducting layers 32 and 34 may be between about 300 angstroms and about 3000 angstroms, preferably between about 500 angstroms and about 1000 angstroms, of phosphorous or arsenic doped silicon having a doping concentration of between about $0.01\text{-}2.0\times10^{21}$ cm$^{-3}$. Other layer thicknesses, doping types and/or doping concentrations may be used. First and second non-metallic conducting layers 32 and 34 may be doped in situ, for example, by flowing a donor gas during deposition. Other doping methods may be used (e.g., implantation).

In alternative exemplary embodiments, first and second non-metallic conducting layers 32 and 34 include p-type silicon. For example, first non-metallic conducting layer 32 and second non-metallic conducting layer 34 may be either deposited and doped by ion implantation or may be doped in situ during deposition to form a p+ silicon layer. For example, a layer of intrinsic silicon may be formed and a blanket p+ implant may be employed to implant boron within the intrinsic silicon. Exemplary implantable molecular ions include boron difluoride ("BF$_2$"), boron trifluoride ("BF$_3$"), boron ("B"), gallium ("Ga"), aluminum ("Al"), and the like. In some embodiments, a doping concentration of between about $0.01\text{-}1.0\times10^{21}$ cm$^{-3}$ may be employed. Other implant species and/or doses may be used. Further, in some embodiments, a diffusion process may be employed. In at least one embodiment, the resultant layer of p+ silicon may have a thickness of between about 300 and about 3000 angstroms, although other thicknesses may be used.

Non-conducting layer 36 may include silicon dioxide, $Al_2O_3$, $Si_3N_4$, BN, or other similar substantially non-conducting material, and have a thickness between about 500 angstroms and about 1000 angstroms, more generally between about 200 angstroms and about 5000 angstroms. Non-conducting layer 36 may be formed using CVD, LPCVD, PECVD, sputtering, or other similar technique. Other materials and/or layer thicknesses may be used.

In the exemplary embodiment of FIG. 3A, carbon-based reversible resistance switching element 12 is disposed about a peripheral sidewall 38 of pillar 30, and is coupled to first non-metallic conducting layer 32 and second non-metallic conducting layer 34. As shown in FIG. 3B, carbon-based reversible resistance switching element 12 may be formed as a ring, or collar, around peripheral sidewall 38 of pillar 30, although other shapes may be used. Thus, in the illustrated embodiment, carbon-based reversible resistance switching element 12 has an outer diameter D2 which is greater than diameter D1 of pillar 30. In some embodiments, outer diameter D2 is between about 320 angstroms and about 1700 angstroms, more generally between about 220 angstroms and about 5200 angstroms. For simplicity, the remaining description will refer to carbon-based reversible resistance switching element 12 as "carbon element 12." Carbon element 12, first conducting layer 32, second conducting layer 34 and non-conducting layer 36 form a MIM 13.

Carbon element 12 may be formed by any suitable process, and at any suitable thickness. For example, carbon element 12 may be graphitic carbon formed by PECVD, and may have a thickness T1 between about 20 angstroms and about 50 angstroms, more generally between about 10 angstroms and about 100 angstroms. Alternatively, carbon element 12 may be formed by chemical vapor deposition ("CVD"), high density plasma ("HDP") deposition, physical vapor deposition ("PVD"), or other similar methods. Persons of ordinary skill in the art will understand that other carbon-based materials, deposition methods and/or thicknesses may be used. For example, carbon element 12 alternatively may be graphene, graphite, carbon nano-tube materials, DLC, silicon carbide, boron carbide, or other similar carbon-based materials.

Table 1 below describes exemplary process conditions for forming nanocrystalline graphitic carbon ("GC") material by PECVD. The graphitic nanocrystalline material may be used to form carbon element 12.

TABLE 1

EXEMPLARY PECVD PROCESS PARAMETERS FOR GC

| PROCESS PARAMETER | BROAD RANGE | NARROW RANGE |
| --- | --- | --- |
| Precursor Flow Rate (sccm) | 50-5000 | 50-100 |
| Carrier/Precursor Ratio | >1:1 | 5:1 < x < 50:1 |
| Chamber Pressure (Torr) | 0.2-10 | 4-6 |
| $1^{st}$ RF frequency (MHz) | 10-50 | 12-17 |
| $2^{nd}$ RF frequency (KHz) | 90-500 | 90-150 |
| $1^{st}$ RF power density (W/cm$^2$) | 0.12-2.80 | 0.19-0.50 |
| $2^{nd}$ RF power density (W/cm$^2$) | 0-2.8 | 0-0.5 |
| Process Temperature (° C.) | 450-650 | 550-650 |
| Heater to Showerhead (Mils) | 300-600 | 325-375 |

Exemplary precursor hydrocarbon compounds may have the formula $C_xH_y$, with x ranging from about 2 to 4, and y ranging from about 2 to 10, and the carrier gas may comprise any suitable inert or non-reactive gas such as one or more of He, Ar, $H_2$, Kr, Xe, $N_2$, etc. Other precursors, carrier gasses, flow rates, ratios, pressures, frequencies, power densities, temperatures, and/or spacings may be used.

Memory cell 10 also may include a dielectric sidewall liner 54, which may include silicon nitride ("$Si_3N_4$"), boron nitride ("BN"), or other similar dielectric material. Sidewall liner 54 may be formed by atomic layer deposition ("ALD"), PECVD, or other similar method and may have a thickness between about 50 angstroms and about 100 angstroms, more generally between about 30 angstroms and about 300 angstroms. Other thicknesses and deposition methods may be used.

Referring again to FIG. 3B, sidewall liner 54 may be formed as a ring, or collar, around carbon-based reversible resistance switching element 12, although other shapes may be used. Consequently, sidewall liner 54 has an outer diameter D3 which is greater than the diameter D1 of pillar 30 and diode 14. Sidewall liner 54 may protect sidewalls of carbon element 12 during a subsequent deposition of an oxygen-rich dielectric 58. Methods and apparatus for forming dielectric sidewall liners are described, for example, in U.S. patent application Ser. No. 12/536,457, filed Aug. 5, 2009 and titled "A Memory Cell That Includes a Carbon-Based Memory Element and Methods of Forming the Same," (the "'457 Application"), which is hereby incorporated by reference in its entirety for all purposes.

Although not wanting to be bound by any particular theory, as illustrated in FIG. 3C, it is believed that current I flowing through MIM 13 flows substantially through first and second non-metallic conducting layers 32 and 34, and the portion 12a of carbon element 12 disposed about non-conducting layer 36. Due to the structure of the memory cell, penetration of metal atoms into carbon element 12 is reduced or eliminated.

Although the exemplary embodiments illustrated in FIG. 3A shows carbon-based reversible resistance switching element 12 above diode 14, persons of ordinary skill in the art will understand that carbon-based reversible resistance switching element 12 alternatively may be positioned below diode 14. Further, although the exemplary memory cell 10 includes MIM 13 coupled to diode 14, persons of ordinary skill in the art will understand that memory cells 10 in accordance with this invention alternatively may include MIM structures coupled between first and second conductors 20 and 22, respectively, for use with remotely fabricated steering elements.

Exemplary Fabrication Processes for Memory Cells

Referring now to FIGS. 4A-M, a first exemplary method of forming an exemplary memory level in accordance with this invention is described. As will be described below, the first memory level includes a plurality of memory cells that each include a steering element and a reversible resistance switching element coupled to the steering element. Additional memory levels may be fabricated above the first memory level (as described previously with reference to FIGS. 2C-2D).

Figure 4A:
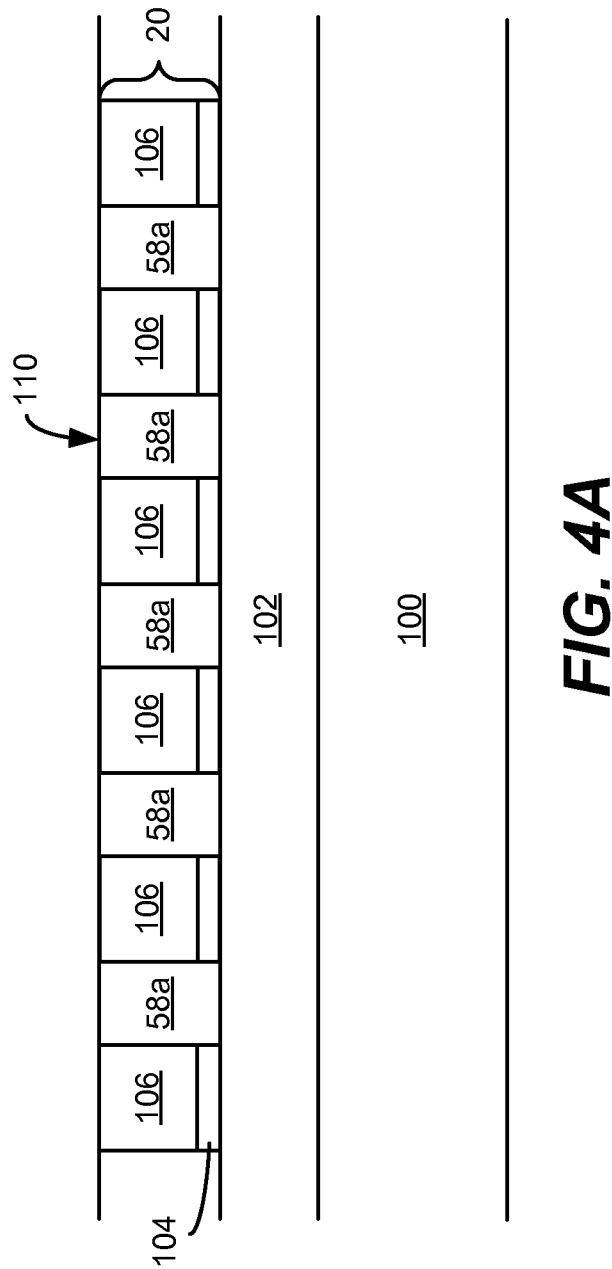
FIGS. 4A-4M illustrate cross-sectional views of a portion of a substrate during an exemplary fabrication of a single memory level in accordance with this invention.

With reference to FIG. 4A, substrate 100 is shown as having already undergone several processing steps. Substrate 100 may be any suitable substrate such as a silicon, germanium, silicon-germanium, undoped, doped, bulk, silicon-on-insulator ("SOI") or other substrate with or without additional circuitry. For example, substrate 100 may include one or more n-well or p-well regions (not shown).

Isolation layer 102 is formed above substrate 100. In some embodiments, isolation layer 102 may be a layer of silicon dioxide, silicon nitride, silicon oxynitride or any other suitable insulating layer.

Following formation of isolation layer 102, an adhesion layer 104 is formed over isolation layer 102 (e.g., by physical vapor deposition or another method). For example, adhesion layer 104 may be between about 20 to about 500 angstroms, and preferably about 100 angstroms, of titanium nitride or another suitable adhesion layer such as tantalum nitride, tungsten nitride, combinations of one or more adhesion layers, or the like. Other adhesion layer materials and/or thicknesses may be employed. In some embodiments, adhesion layer 104 may be optional.

After formation of adhesion layer 104, a conductive layer 106 is deposited over adhesion layer 104. Conductive layer 106 may include any suitable conductive material such as tungsten or another appropriate metal, heavily doped semiconductor material, a conductive silicide, a conductive silicide-germanide, a conductive germanide, or the like deposited by any suitable method (e.g., chemical vapor deposition ("CVD"), PVD, etc.). In at least one embodiment, conductive layer 106 may comprise between about 200 angstroms to about 2500 angstroms of tungsten. Other conductive layer materials and/or thicknesses may be used.

Following formation of conductive layer 106, adhesion layer 104 and conductive layer 106 are patterned and etched. For example, adhesion layer 104 and conductive layer 106 may be patterned and etched using conventional lithography techniques, with a soft or hard mask, and wet or dry etch processing. In at least one embodiment, adhesion layer 104 and conductive layer 106 are patterned and etched to form substantially parallel, substantially co-planar first conductors 20. Exemplary widths for first conductors 20 and/or spacings between first conductors 20 are between about 200 angstroms and about 2500 angstroms, although other conductor widths and/or spacings may be used.

After first conductors 20 have been formed, a dielectric layer 58a is formed over substrate 100 to fill the voids between first conductors 20. For example, approximately 3000-7000 angstroms of silicon dioxide may be deposited on the substrate 100 and planarized using chemical mechanical polishing or an etchback process to form a planar surface 110. Planar surface 110 includes exposed top surfaces of first conductors 20 separated by dielectric material (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

In other embodiments of the invention, first conductors 20 may be formed using a damascene process in which dielectric layer 58a is formed, patterned and etched to create openings or voids for first conductors 20. The openings or voids then may be filled with adhesion layer 104 and conductive layer 106 (and/or a conductive seed, conductive fill and/or barrier layer if needed). Adhesion layer 104 and conductive layer 106 then may be planarized to form planar surface 110. In such an embodiment, adhesion layer 104 will line the bottom and sidewalls of each opening or void.

Figure 4B:
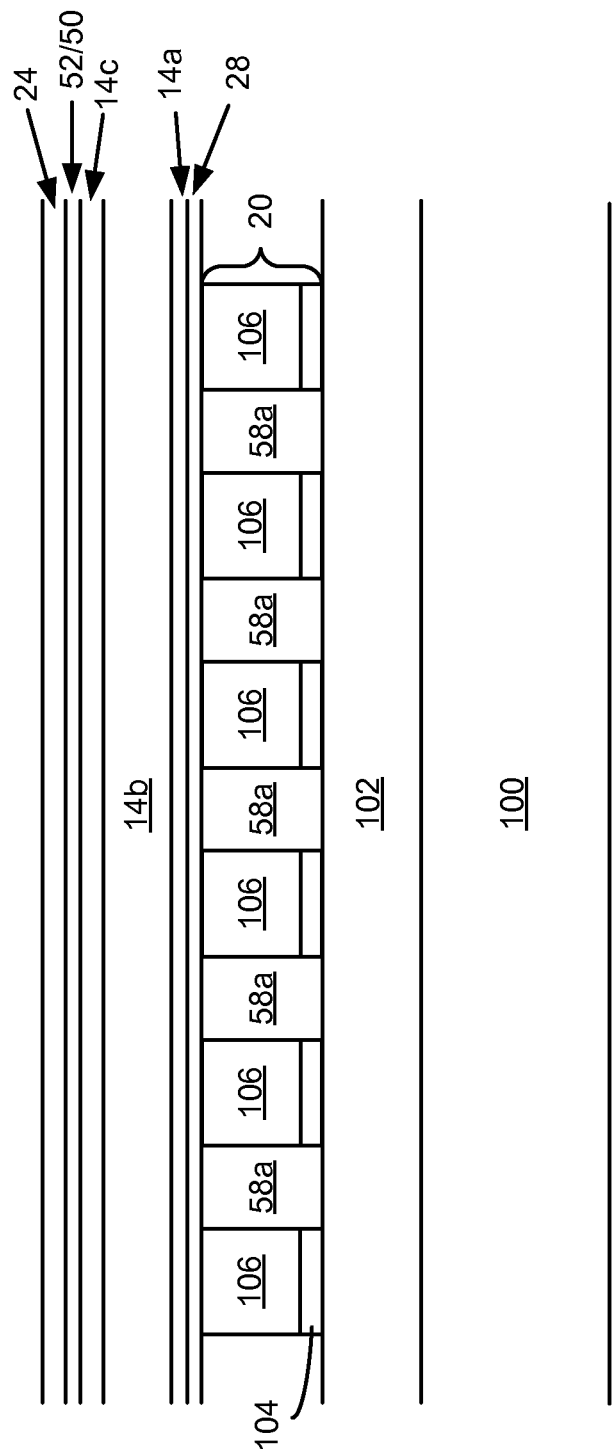

Following planarization, the diode structures of each memory cell are formed. With reference to FIG. 4B, a barrier layer 28 is formed over planarized top surface 110 of substrate 100. Barrier layer 28 may be between about 20 angstroms and about 500 angstroms, and preferably about 100 angstroms, of titanium nitride or another suitable barrier layer such as tantalum nitride, tungsten nitride, tungsten, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed.

After deposition of barrier layer 28, deposition of the semiconductor material used to form the diode of each memory cell begins (e.g., diode 14 in FIGS. 2 and 3). Each diode may be a vertical p-n or p-i-n diode as previously described. In some embodiments, each diode is formed from a polycrystalline semiconductor material such as polysilicon, a polycrystalline silicon-germanium alloy, polygermanium or any other suitable material. For convenience, formation of a polysilicon, downward-pointing diode is described herein. It will be understood that other materials and/or diode configurations may be used.

With reference to FIG. 4B, following formation of barrier layer 28, a heavily doped n+ silicon layer 14a is deposited on barrier layer 28. In some embodiments, n+ silicon layer 14a is in an amorphous state as deposited. In other embodiments, n+ silicon layer 14a is in a polycrystalline state as deposited. CVD or another suitable process may be employed to deposit n+ silicon layer 14a. In at least one embodiment, n+ silicon layer 14a may be formed, for example, from about 100 angstroms to about 1000 angstroms, preferably about 100 angstroms, of phosphorus or arsenic doped silicon having a doping concentration of about $1 \times 10^{21}$ cm$^{-3}$. Other layer thicknesses, doping types and/or doping concentrations may be used. N+ silicon layer 14a may be doped in situ, for example, by flowing a donor gas during deposition. Other doping methods may be used (e.g., implantation).

After deposition of n+ silicon layer 14a, a lightly doped, intrinsic and/or unintentionally doped silicon layer 14b is formed over n+ silicon layer 14a. In some embodiments, intrinsic silicon layer 14b is in an amorphous state as deposited. In other embodiments, intrinsic silicon layer 14b is in a polycrystalline state as deposited. CVD or another suitable deposition method may be employed to deposit intrinsic silicon layer 14b. In at least one embodiment, intrinsic silicon layer 14b may be about 500 angstroms to about 4800 angstroms, preferably about 2500 angstroms, in thickness. Other intrinsic layer thicknesses may be used.

A thin (e.g., a few hundred angstroms or less) germanium and/or silicon-germanium alloy layer (not shown) may be formed on n+ silicon layer 14a prior to depositing intrinsic silicon layer 14b to prevent and/or reduce dopant migration from n+ silicon layer 14a into intrinsic silicon layer 14b (as described in the '331 Application, previously incorporated).

Heavily doped, p-type silicon is either deposited and doped by ion implantation or is doped in situ during deposition to form a p+ silicon layer 14c. For example, a blanket p+ implant may be employed to implant boron a predetermined depth within intrinsic silicon layer 14b. Exemplary implantable molecular ions include $BF_2$, $BF_3$, B, Ga, Al and the like. In some embodiments, an implant dose of about $1-5 \times 10^{15}$ ions/cm$^2$ may be employed. Other implant species and/or doses may be used. Further, in some embodiments, a diffusion process may be employed. In at least one embodiment, the resultant p+ silicon layer 14c has a thickness of between about 100 angstroms and about 700 angstroms, although other p+ silicon layer sizes may be used.

Following formation of p+ silicon layer 14c, a silicide-forming metal layer 52 is deposited over p+ silicon layer 14c. Exemplary silicide-forming metals include sputter or otherwise deposited titanium or cobalt. In some embodiments, silicide-forming metal layer 52 has a thickness of between about 10 angstroms and about 200 angstroms, preferably between about 20 angstroms and about 50 angstroms and more preferably about 20 angstroms. Other silicide-forming metal layer materials and/or thicknesses may be used. A nitride layer (not shown) may be formed at the top of silicide-forming metal layer 52.

Following formation of silicide-forming metal layer 52, an RTA step may be performed at about 540° C. for about one minute to form silicide layer 50, consuming all or a portion of the silicide-forming metal layer 52. Following the RTA step, any residual nitride layer from silicide-forming metal layer 52 may be stripped using a wet chemistry, as described above, and as is known in the art.

A barrier layer 24 is deposited over silicide-forming metal layer 52. Barrier layer 24 may be between about 20 angstroms and about 500 angstroms, and more preferably about 200 angstroms, of titanium nitride or another suitable barrier layer such as tantalum nitride, tungsten nitride, tungsten, molybdenum, combinations of one or more barrier layers, barrier layers in combination with other layers such as titanium/titanium nitride, tantalum/tantalum nitride or tungsten/tungsten nitride stacks, or the like. Other barrier layer materials and/or thicknesses may be employed. Any suitable method may be used to form barrier layer 56. For example, PVD, ALD, or the like may be employed.

Figure 4C:
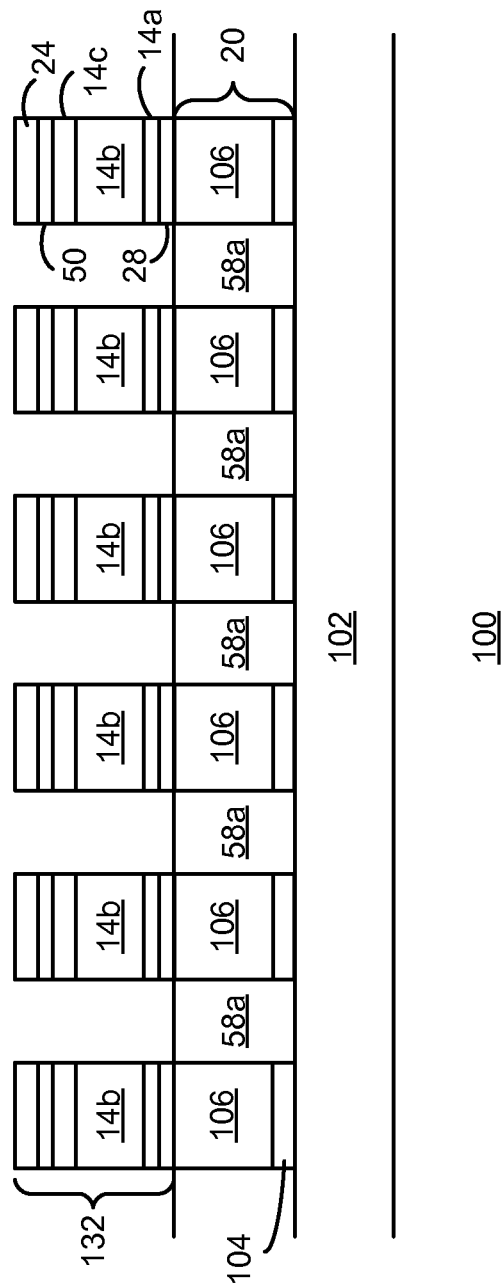
Figure 4D:
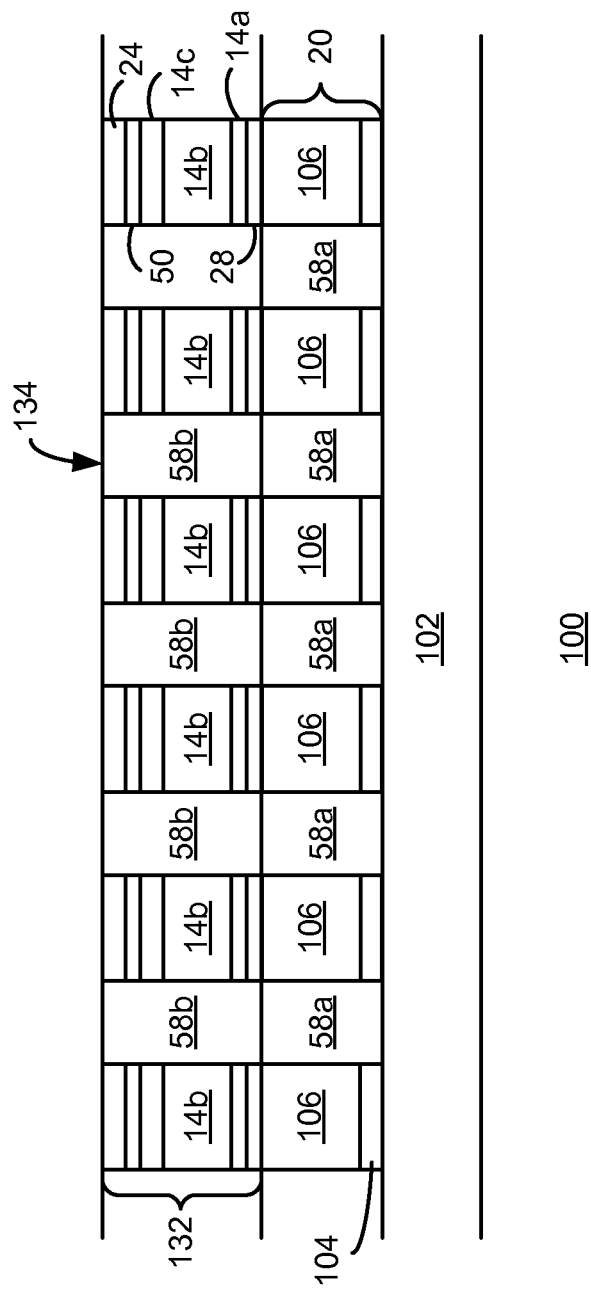

As shown in FIG. 4C, barrier layer 24, silicide layer 50, diode layers 14a-14c and barrier layer 28 are patterned and etched to form pillars 132. Pillars 132 may have about the same pitch and about the same width as conductors 20 below, such that each pillar 132 is formed on top of a conductor 20. Some misalignment may be tolerated.

For example, photoresist may be deposited, patterned using standard photolithography techniques, layers 24, 50, 14a-14c, and 28 may be etched, and then the photoresist may be removed. Alternatively, a hard mask of some other material, for example silicon dioxide, may be formed on top of the barrier layer 24, with bottom antireflective coating ("BARC") on top, then patterned and etched. Similarly, dielectric antireflective coating ("DARC") may be used as a hard mask.

Pillars 132 may be formed using any suitable masking and etching process. For example, layers 24, 50, 14a-14c, and 28 may be patterned with about 1 micron to about 1.5 micron, more preferably about 1.2 micron to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

Any suitable etch chemistries, and any suitable etch parameters, flow rates, chamber pressures, power levels, process temperatures, and/or etch rates may be used.

After etching, pillars 132 may be cleaned using a dilute hydrofluoric/sulfuric acid clean. Such cleaning, whether or not PR ashing is performed before etching, may be performed in any suitable cleaning tool, such as a Raider tool, available from Semitool of Kalispell, Mont. Exemplary post-etch cleaning may include using ultra-dilute sulfuric acid (e.g., about 1.5-1.8 wt %) for about 60 seconds and ultra-dilute hydrofluoric ("HF") acid (e.g., about 0.4-0.6 wt) for 60 seconds. Megasonics may or may not be used.

After pillars 132 have been cleaned, a dielectric layer 58b may be deposited over pillars 132 to fill the voids between pillars 132. For example, approximately 200-7000 angstroms of silicon dioxide may be deposited and planarized using chemical mechanical polishing or an etchback process to remove excess dielectric material 58b and form a planar surface 134, resulting in the structure illustrated in FIG. 4D. Planar surface 134 includes exposed top surfaces of pillars 132 separated by dielectric material 58b (as shown). Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like.

Figure 4E:
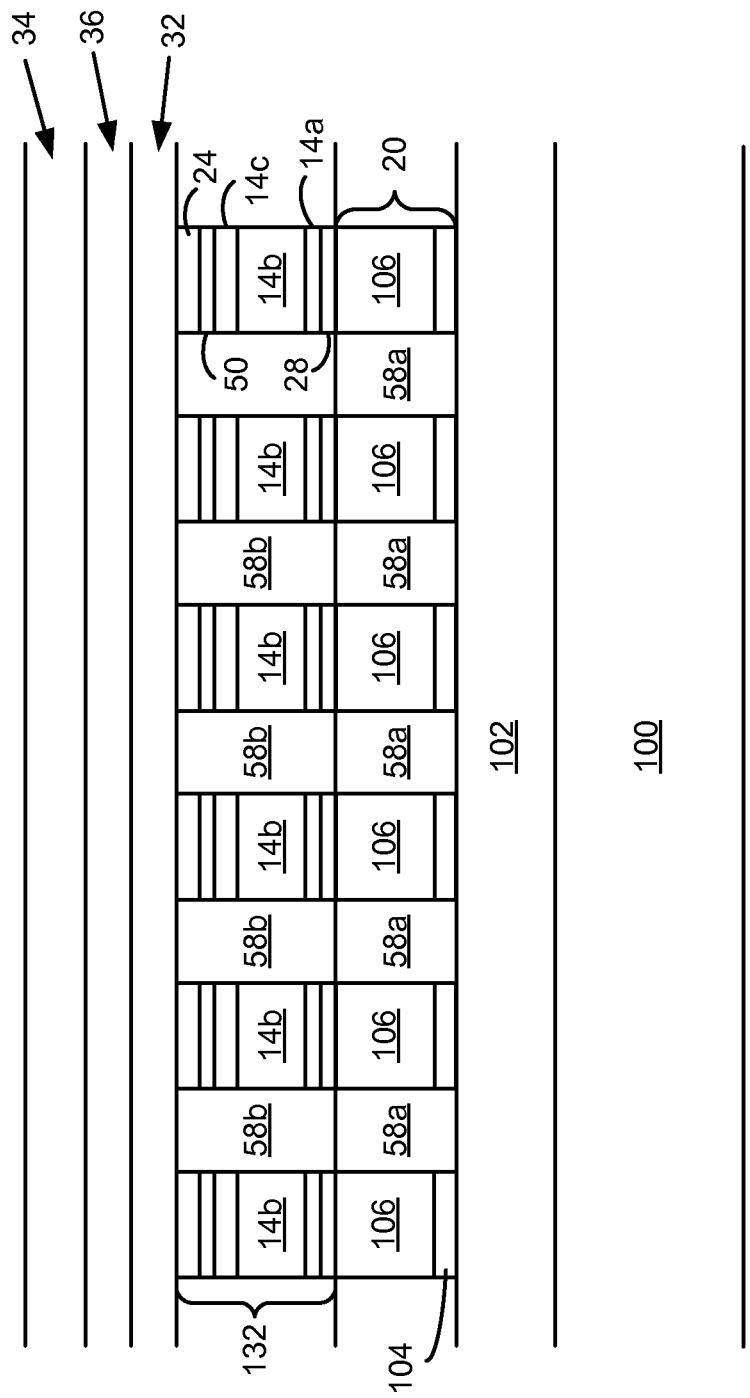

With reference to FIG. 4E, first non-metallic conducting layer 32, non-conducting layer 36, and second non-metallic conducting layer 34 are formed over planarized surface 134. As discussed above, first non-metallic conducting layer 32 and second non-metallic layer 34 may include heavily doped silicon, heavily-doped SiC, TaC, WC, or other similar non-conducting material.

For example, first non-metallic conducting layer 32 and second non-metallic conducting layer 34 may include heavily doped n+ silicon which is deposited in an amorphous state and then doped. Alternatively, first non-metallic conducting layer 32 and second non-metallic conducting layer 34 may include n+ silicon which is deposited in a polycrystalline state and then doped. CVD or another suitable process may be employed to deposit first non-metallic conducting layer 32 and second non-metallic conducting layer 34. In at least one embodiment, first non-metallic conducting layer 32 and second non-metallic conducting layer 34 may be formed, for example, between about 300 angstroms and about 3000 angstroms, preferably between about 500 angstroms and about 1000 angstroms, of phosphorous or arsenic doped silicon having a doping concentration of between about $0.01-2.0 \times 10^{21}$ cm$^{-3}$. Other layer thicknesses, doping types and/or doping concentrations may be used. First non-metallic conducting layer 32 and second non-metallic conducting layer 34 may be doped in situ, for example, by flowing a donor gas during deposition. Other doping methods may be used (e.g., implantation).

In some embodiments, first non-metallic conducting layer 32 and second non-metallic conducting layer 34 may include p-type silicon. For example, first non-metallic conducting layer 32 and second non-metallic conducting layer 34 may be either deposited and doped by ion implantation or may be doped in situ during deposition to form a p+ silicon layer. For example, a layer of intrinsic silicon may be formed and a blanket p+ implant may be employed to implant boron within the intrinsic silicon. Exemplary implantable molecular ions include $BF_2$, $BF_3$, B, Ga, Al, and the like. In some embodiments, a doping concentration of between about $0.01-1.0 \times 10^{21}$ cm$^{-3}$ may be employed. Other implant species and/or doses may be used. Further, in some embodiments, a diffusion process may be employed. In at least one embodiment, the resultant layer of p+ silicon may have a thickness between about 300 angstroms and about 3000 angstroms, preferably between about 500 angstroms and about 1000 angstroms, although other thicknesses may be used.

Non-conducting layer 36 may include $SiO_2$, $Al_2O_3$, $HfO_2$, MgO, ZrO, $Si_3N_4$, BN, AN, or other similar substantially non-conducting material, and have a thickness between about 500 angstroms and about 1000 angstroms, more generally between about 200 angstroms and about 5000 angstroms. Other non-conducting materials and/or layer thicknesses may be used. Non-conducting layer 36 may be formed using CVD, LPCVD, PECVD, sputtering, or other similar technique.

Figure 4F:
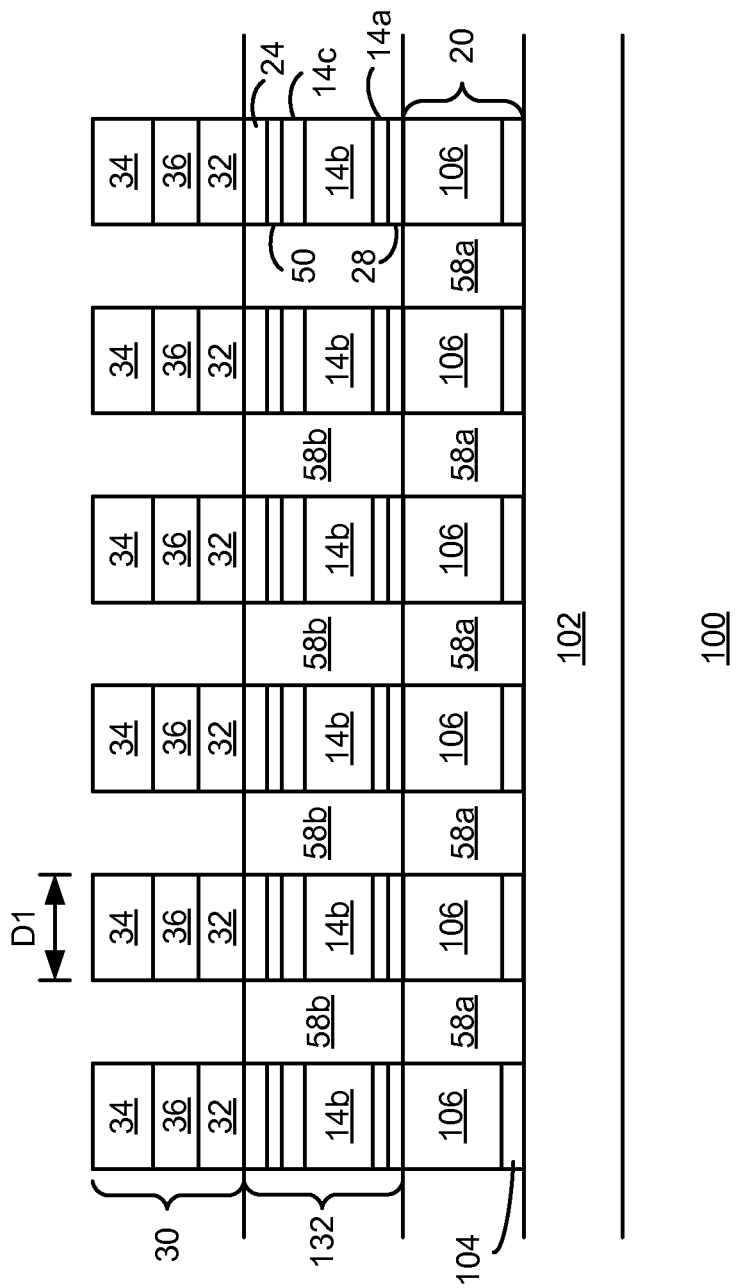

As shown in FIG. 4F, first non-metallic conducting layer 32, non-conducting layer 36, and second non-metallic conducting layer 34 are patterned and etched to form pillars 30. For example, photoresist may be deposited, patterned using standard photolithography techniques, layers 32, 34, and 36 may be etched, and then the photoresist may be removed. Alternatively, a hard mask of some other material, for example silicon dioxide, may be formed on top of the layer 34, with bottom antireflective coating ("BARC") on top, then patterned and etched. Similarly, dielectric antireflective coating ("DARC") may be used as a hard mask.

Pillars 30 may be formed using any suitable masking and etching process. For example, layers 32, 34, and 36 may be patterned with about 1 micron to about 1.5 micron, more preferably about 1.2 micron to about 1.4 micron, of photoresist ("PR") using standard photolithographic techniques. Thinner PR layers may be used with smaller critical dimensions and technology nodes. In some embodiments, an oxide hard mask may be used below the PR layer to improve pattern transfer and protect underlying layers during etching.

Any suitable etch chemistries, and any suitable etch parameters, flow rates, chamber pressures, power levels, process temperatures, and/or etch rates may be used. After etching, pillars 30 may be cleaned using a dilute hydrofluoric/sulfuric acid clean, such as described above.

Pillars 30 may have about the same pitch, and about the same diameter D1, as diodes 14 below, such that each pillar 30 is formed on top of a diode 14. Some misalignment may be tolerated. Persons of ordinary skill in the art will understand that pillars 30 alternatively may have diameters larger or smaller than the diameters of diodes 14.

Figure 4G:
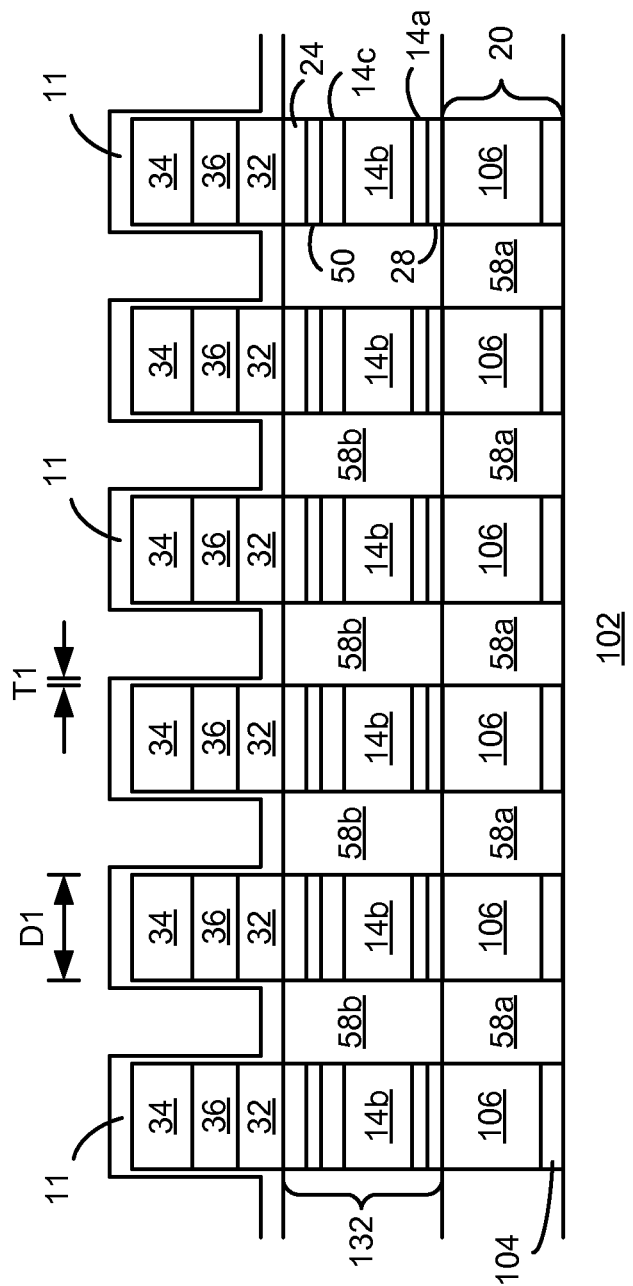

After pillars 30 have been cleaned, a layer 11 of carbon material may be conformally deposited over pillars 30, resulting in the structure shown in FIG. 4G. For example, carbon layer 11 may be formed by using PECVD to conformally deposit between about 20 angstroms and about 50 angstroms, more generally between about 10 angstroms and about 100 angstroms of graphitic carbon. Exemplary process parameters for forming GC material by PECVD are described in Table 1 above. Persons of ordinary skill in the art will understand that other carbon-based materials, deposition methods and/or thicknesses may be used. For example, carbon layer 11 alternatively may be graphene, graphite, carbon nano-tube materials, DLC, silicon carbide, boron carbide, or other similar carbon-based materials.

As illustrated in FIG. 4G, carbon layer 11 has a vertical sidewall thickness T1. In some embodiments, carbon layer 11 has a vertical sidewall thickness T1 of between about 10 angstroms and about 100 angstroms, and more preferably between about 20 angstroms and about 50 angstroms. In at least one embodiment, T1 is about 50 angstroms. Other thicknesses may be used.

In some embodiments, following formation of carbon layer 11, an anneal step may be performed prior to deposition of additional material. In particular, the anneal may be performed in a vacuum or the presence of one or more forming gases, at a temperature in the range from about 350° C. to about 900° C., for about 30 to about 180 minutes. The anneal preferably is performed in about an 80% ($N_2$):20% ($H_2$) mixture of forming gases, at about 625° C. for about one hour.

Suitable forming gases may include one or more of $N_2$, Ar, and $H_2$, whereas preferred forming gases may include a mixture having above about 75 $N_2$ or Ar and below about 25 $H_2$. Alternatively, a vacuum may be used. Suitable temperatures may range from about 350° C. to about 900° C., whereas preferred temperatures may range from about 585° C. to about 675° C. Suitable durations may range from about 0.5 hour to about 3 hours, whereas preferred durations may range from about 1 hour to about 1.5 hours. Suitable pressures may range from about 1 mT to about 760 T, whereas preferred pressures may range from about 300 mT to about 600 mT.

A queue time of preferably about 2 hours between the anneal and the deposition of additional layers preferably accompanies the use of the anneal. A ramp up duration may range from about 0.2 hours to about 1.2 hours and preferably is between about 0.5 hours and 0.8 hours. Similarly, a ramp down duration also may range from about 0.2 hours to about 1.2 hours and preferably is between about 0.5 hours and 0.8 hours.

Although not wanting to be bound by any particular theory, it is believed that carbon-based material may absorb water from the air over time. Likewise, it is believed that the moisture may increase the likelihood of de-lamination of the carbon-based material. In some cases, it also might be acceptable to have a queue time of 2 hours from the time of deposition of carbon-based material to deposition of additional layers, skipping the anneal altogether.

Incorporation of such a post-carbon-formation-anneal preferably takes into account other layers of the memory cell, because these other memory cell layers will also be subject to the anneal. For example, the anneal may be omitted or its parameters may be adjusted where the aforementioned preferred anneal parameters would damage the other memory cell layers. The anneal parameters may be adjusted within ranges that result in the removal of moisture without damaging the layers of the annealed memory cell. For instance, the temperature may be adjusted to stay within an overall thermal budget of a memory cell being formed. Likewise, any suitable forming gases, temperatures and/or durations may be used that are appropriate for a particular memory cell. In general, such an anneal may be used with any carbon-based layer or carbon-containing material, such as layers having CNT material, graphite, graphene, amorphous carbon, etc.

Figure 4H:
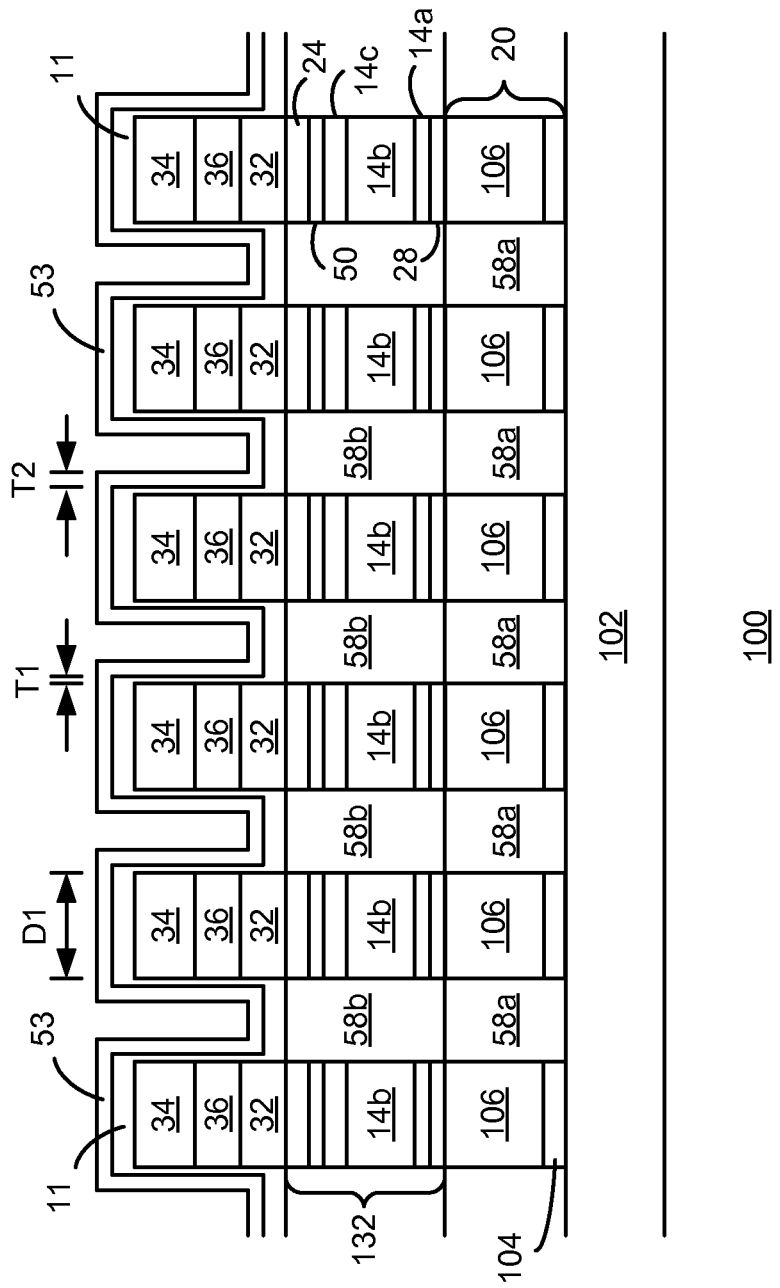

As illustrated in FIG. 4H, a conformal dielectric layer 53 is deposited above carbon layer 11. Dielectric layer 53 may be formed using silicon nitride, silicon oxynitride, boron nitride, low K dielectrics, or other similar dielectric material. Exemplary low K dielectrics include carbon doped oxides, silicon carbon layers, or the like. Dielectric layer 53 has a vertical sidewall thickness T2. In some embodiments, dielectric layer 53 has a vertical sidewall thickness T2 between about 30 angstroms and about 300 angstroms, and more preferably between about 50 angstroms and about 100 angstroms. In at least one exemplary embodiment, T2 is about 300 angstroms. Other thicknesses may be used. Any suitable method may be used to form layer 53. For example, PECVD, ALD, or the like may be employed.

Figure 4I:
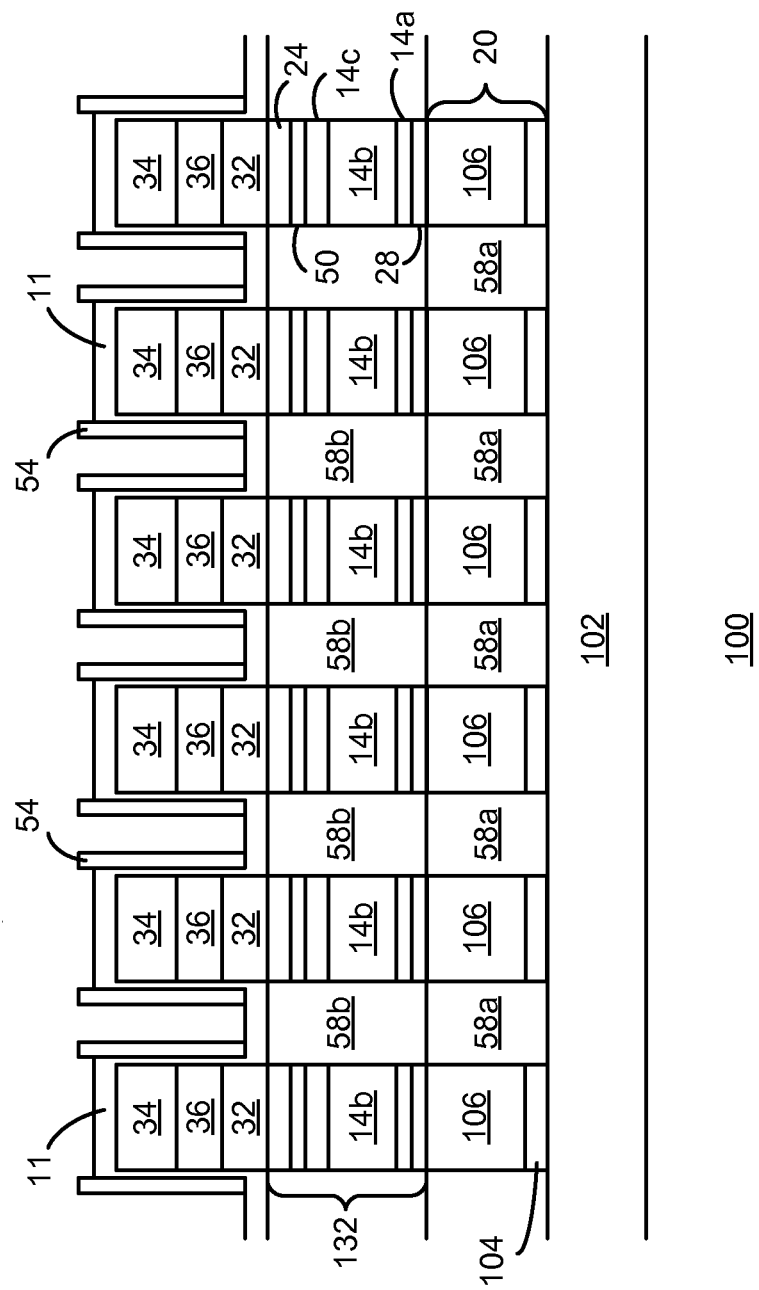

Next an anisotropic etch is used to remove lateral portions of dielectric layer 53, leaving only sidewall portions 54, as illustrated in FIG. 4I. For example, a sputter etch or other suitable process may be used to anisotropically etch dielectric layer 53. Other etch processes may be used.

Figure 4J:
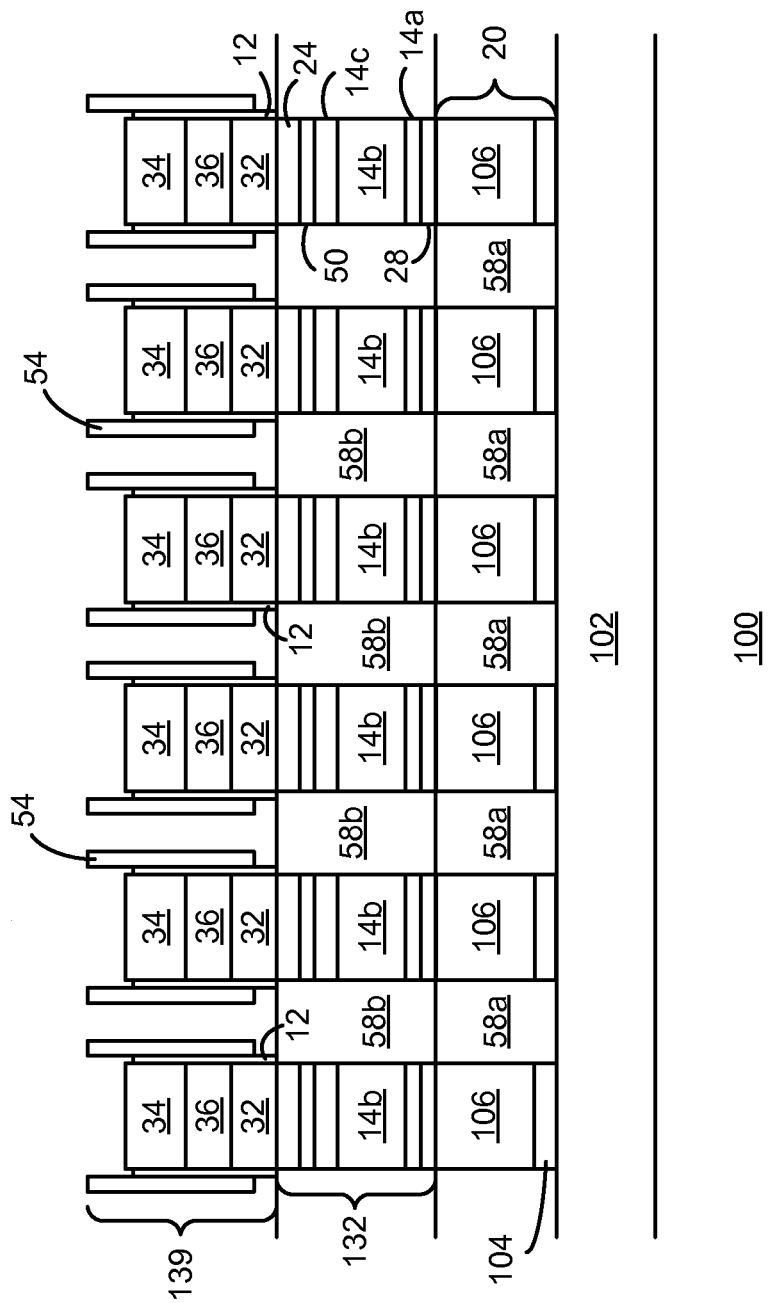

A second anisotropic etch is used to remove lateral portions of carbon layer 11, leaving only sidewall portions as carbon element 12, resulting in substantially parallel pillars 139, as illustrated in FIG. 4J. For example, a sputter etch or other suitable process may be used to anisotropically etch carbon layer 11. As shown in FIG. 4J, the second etch may remove a portion of carbon layer 11 below a bottom edge of dielectric sidewall liners 54.

Figure 4K:
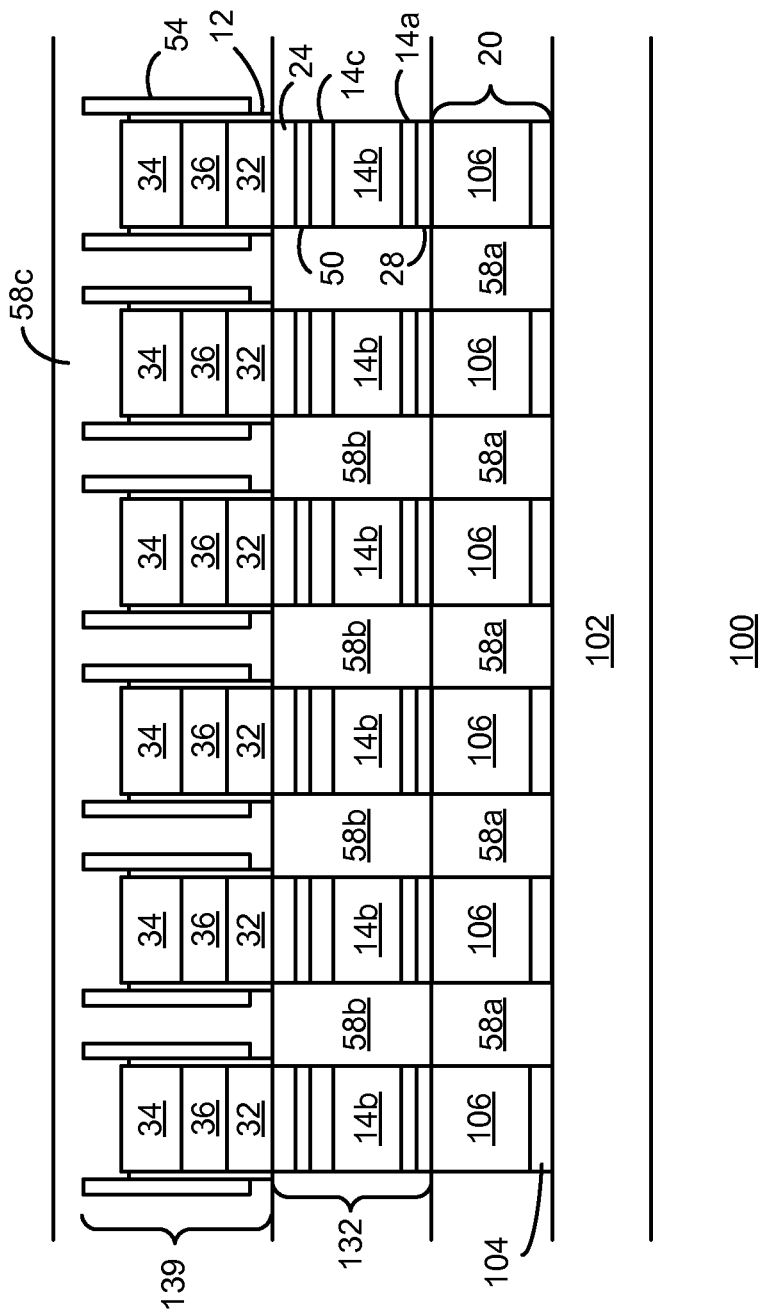
Figure 4L:
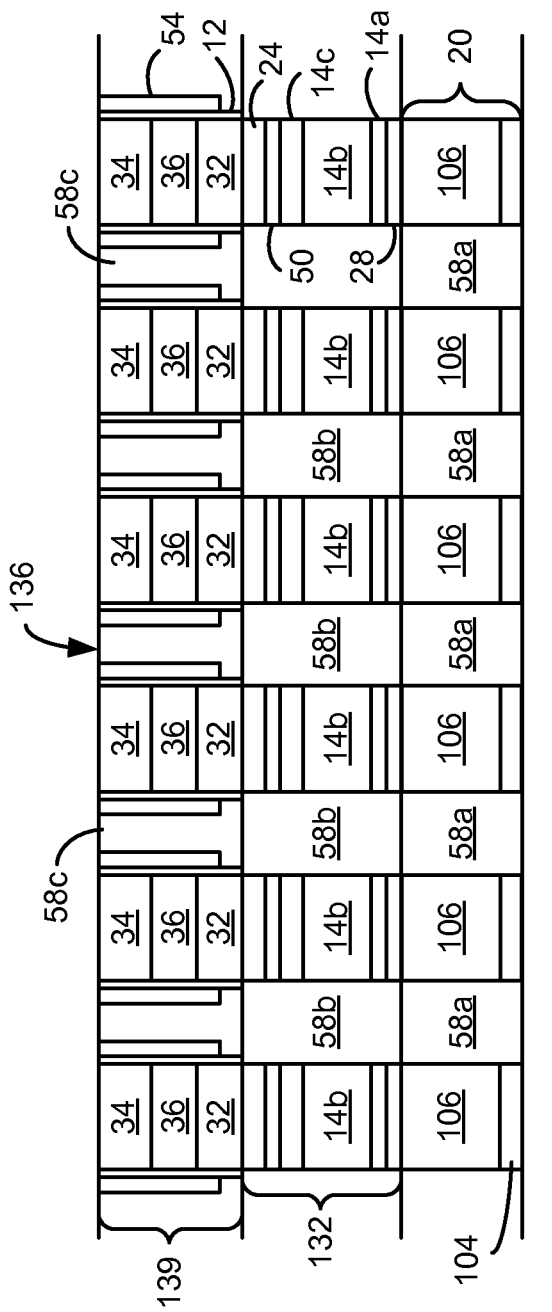

With reference to FIG. 4K, a dielectric layer 58c is deposited over pillars 139 to fill the voids between pillars 139. For example, approximately 1500 to about 3500 angstroms of silicon dioxide may be deposited. Other dielectric materials such as silicon nitride, silicon oxynitride, low K dielectrics, etc., and/or other dielectric layer thicknesses may be used. Exemplary low K dielectrics include carbon doped oxides, silicon carbon layers, or the like. The structure is planarized using chemical mechanical polishing or an etchback process to remove excess dielectric material 58c and form a planar surface 136, resulting in the structure illustrated in FIG. 4L. Planarization may remove portions of dielectric sidewall liner 54, carbon element 12, and non-metallic conducting layer 34. Accordingly, planar surface 136 includes exposed top surfaces of pillars 139 separated by dielectric material 58c (as shown).

Figure 4M:
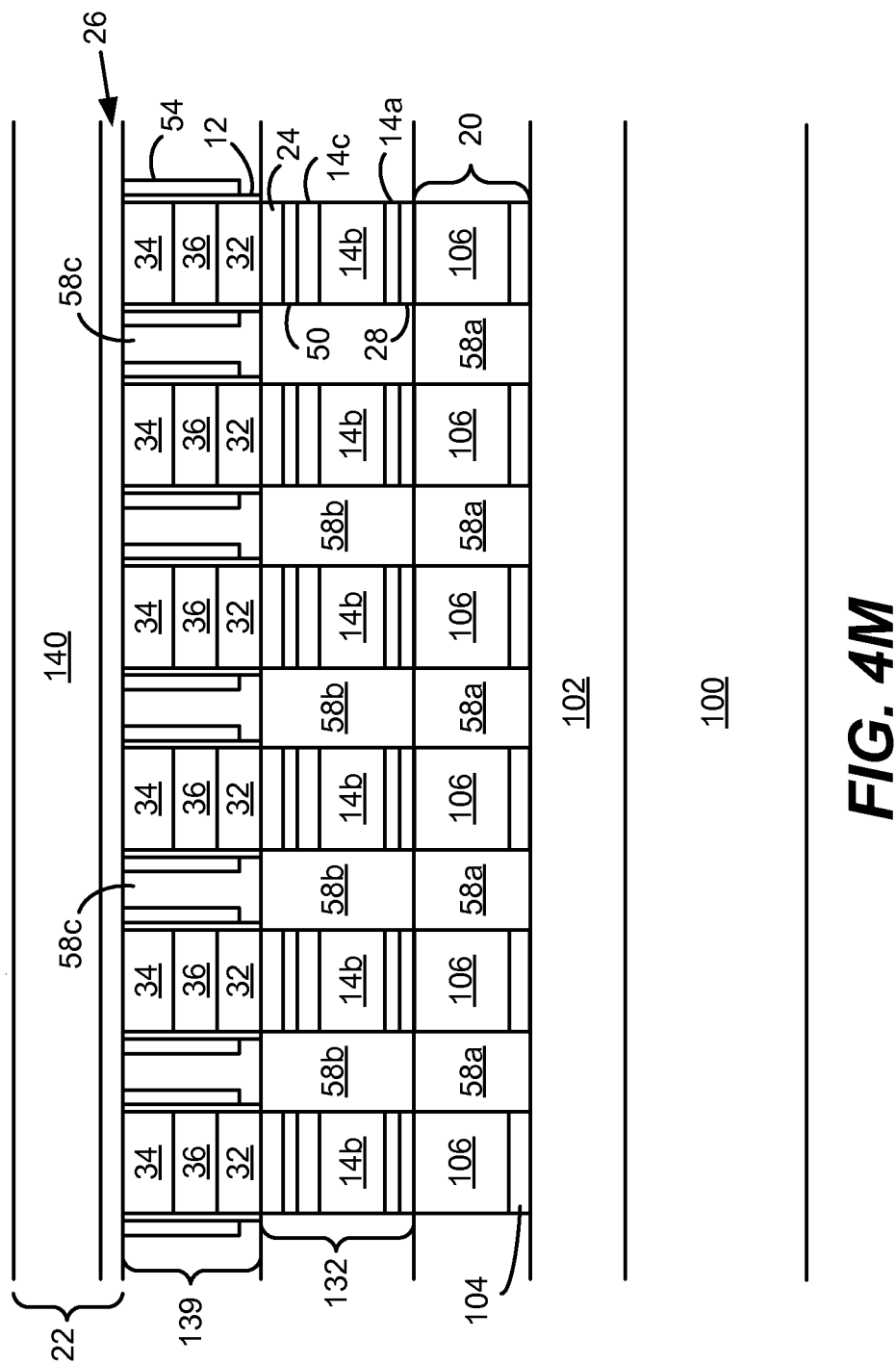

With reference to FIG. 4M, following planarization of dielectric layer 58c, a second conductor 22 is formed above pillars 139 in a manner similar to the formation of first conductors 20. For example, in some embodiments, one or more barrier layers and/or adhesion layers 26 may be deposited prior to deposition of a conductive layer 140 used to form the second conductor 22.

Conductive layer 140 may be formed from any suitable conductive material such as tungsten, another suitable metal, heavily doped semiconductor material, a conductive silicide, a conductive silicide-germanide, a conductive germanide, or the like deposited by any suitable method (e.g., CVD, PVD, etc.). Barrier layers and/or adhesion layers 26 may include titanium nitride or another suitable layer such as tantalum nitride, tungsten nitride, combinations of one or more layers, or any other suitable material(s). In at least one embodiment, conductive layer 140 may comprise about 200 to about 2500 angstroms of tungsten, and barrier/adhesion layer 26 may comprise about 20 to about 500 angstroms of TiN. Other conductive layer and barrier layer materials and/or thicknesses may be used.

The deposited conductive layer 140 and barrier and/or adhesion layer 26, may be patterned and etched to form second conductors 22. In at least one embodiment, second conductors 22 are substantially parallel, substantially coplanar conductors that extend in a different direction than first conductors 20.

In other embodiments of the invention, second conductors 22 may be formed using a damascene process in which a dielectric layer is formed, patterned and etched to create openings or voids for conductors 22. The openings or voids may be filled with adhesion layer 26 and conductive layer 140 (and/or a conductive seed, conductive fill and/or barrier layer if needed). Adhesion layer 26 and conductive layer 140 then may be planarized to form a planar surface.

Following formation of second conductors 22, the resultant structure may be annealed to crystallize the deposited semiconductor material of diodes 14 (and/or to form silicide regions by reaction of the silicide-forming metal layer 52 with p+ region 14c). In at least one embodiment, the anneal may be performed for about 10 seconds to about 2 minutes in nitrogen at a temperature of about 600° C. to 800° C., and more preferably between about 650° C. and 750° C. Other annealing times, temperatures and/or environments may be used. The silicide regions formed as each silicide-forming metal layer region 52 and p+ region 14c react may serve as "crystallization templates" or "seeds" during annealing for underlying deposited semiconductor material that forms diodes 14 (e.g., changing any amorphous semiconductor material to polycrystalline semiconductor material and/or improving overall crystalline properties of diodes 14). Lower resistivity diode material thereby is provided.

The foregoing description discloses only exemplary embodiments of the invention. Modifications of the above disclosed apparatus and methods which fall within the scope of the invention will be readily apparent to those of ordinary skill in the art. For instance, in any of the above embodiments, pillars 30 and carbon elements 12 may be located below the diodes 14. In addition, memory cells in accordance with this invention may be used with a remotely located steering elements, such as a thin film transistors, diodes, or other similar steering elements. As stated, although the invention has been described primarily with reference to amorphous carbon, other carbon-based resistivity switching materials may be similarly used. Further, each carbon-based switching layer is preferably formed between two conducting layers such as titanium nitride or other barrier/adhesion layers to form a MIM stack in series with a steering element.

Accordingly, although the present invention has been disclosed in connection with exemplary embodiments thereof, it should be understood that other embodiments may fall within the spirit and scope of the invention, as defined by the following claims.

The invention claimed is:

1. A method comprising:
forming a reversible resistance-switching metal-insulator-metal ("MIM") structure by:
    forming a first non-metallic conducting layer;
    forming a non-conducting layer above the first non-metallic conducting layer;
    forming a second non-metallic conducting layer above the non-conducting layer;
    etching the first non-metallic conducting layer, non-conducting layer and second non-metallic conducting layer to form a pillar; and
    disposing a carbon material layer about a sidewall of the pillar, wherein the carbon material layer is conductively coupled to the first non-metallic conducting layer and the second non-metallic conducting layer,
wherein the first non-metallic conducting layer and/or the second non-metallic conducting layer comprises a heavily doped semiconductor material.

2. The method of claim 1, wherein the semiconductor material comprises heavily doped n+ silicon.

3. The method of claim 1, wherein the semiconductor material comprises silicon doped with one or more of phosphorous or arsenic, and having a doping concentration of between about $0.01\text{-}2.0 \times 10^{21}$ cm−3.

4. The method of claim 1, wherein the semiconductor material comprises heavily doped p+ silicon.

5. The method of claim 1, wherein the semiconductor material comprises silicon doped with one or more of boron difluoride, boron trifluoride, boron, gallium, and aluminum, and having a doping concentration of between about $0.01\text{-}1.0 \times 10^{21}$ cm−3.

6. The method of claim 1, wherein the non-conducting layer comprises a dielectric material.

7. The method of claim 1, wherein the pillar has a diameter between about 200 angstroms and about 5000 angstroms.

8. The method of claim 1, wherein the carbon material layer has a thickness between about 10 angstroms and about 100 angstroms.

9. The method of claim 1, wherein disposing the carbon material layer comprises depositing a conformal carbon material layer over the pillar.

10. The method of claim 9, further comprising depositing a conformal dielectric material layer over the carbon material layer.

11. The method of claim 10, further comprising removing lateral portions of the dielectric material layer.

12. The method of claim 11, further comprising removing lateral portions of the carbon material layer.

13. The method of claim 1, wherein disposing the carbon material layer comprises forming the carbon material layer as a ring, or collar, around a peripheral sidewall of the pillar.

14. The method of claim 1, wherein the carbon material layer comprises one or more of amorphous carbon containing nanocrystalline graphene, graphene, graphite, carbon nanotube, diamond-like carbon, silicon carbide, and boron carbide.

15. A method comprising:
forming a reversible resistance-switching metal-insulator-metal ("MIM") structure by:
    forming a first non-metallic conducting layer;
    forming a non-conducting layer above the first non-metallic conducting layer;
    forming a second non-metallic conducting layer above the non-conducting layer;

etching the first non-metallic conducting layer, non-conducting layer and second non-metallic conducting layer to form a pillar; and disposing a carbon material layer about a sidewall of the pillar, wherein the carbon material layer is conductively coupled to the first non-metallic conducting layer and the second non-metallic conducting layer, wherein the first non-metallic conducting layer and/or the second non-metallic conducting layer comprises one or more of: (a) heavily doped silicon, germanium, silicon-germanium, or silicon carbide; (b) tantalum carbide, and (c) tungsten carbide.

16. A method comprising:

forming a reversible resistance-switching metal-insulator-metal ("MIM") structure by:

forming a first non-metallic conducting layer;

forming a non-conducting layer above the first non-metallic conducting layer;

forming a second non-metallic conducting layer above the non-conducting layer;

etching the first non-metallic conducting layer, non-conducting layer and second non-metallic conducting layer to form a pillar; and disposing a carbon material layer about a sidewall of the pillar, wherein the carbon material layer is conductively coupled to the first non-metallic conducting layer and the second non-metallic conducting layer, wherein the non-conducting layer comprises one or more of silicon dioxide, aluminum oxide, hafnium dioxide, magnesium oxide, zirconium oxide, silicon nitride, boron nitride, and aluminum nitride.

\* \* \* \* \*